United States Patent
Lafalce et al.

(10) Patent No.: US 9,722,180 B2
(45) Date of Patent: Aug. 1, 2017

(54) MASK-STACK-SHIFT METHOD TO FABRICATE ORGANIC SOLAR ARRAY BY SPRAY

(71) Applicants: Evan Lafalce, Salt Lake City, UT (US); Jason Erik Lewis, Lutz, FL (US); Adam Flanery, Clearwater, FL (US); Xiaomei Jiang, Tampa, FL (US)

(72) Inventors: Evan Lafalce, Salt Lake City, UT (US); Jason Erik Lewis, Lutz, FL (US); Adam Flanery, Clearwater, FL (US); Xiaomei Jiang, Tampa, FL (US)

(73) Assignee: University of South Florida, Tampa, FL (US)

(*) Notice: Subject to any disclaimer, the term of this patent is extended or adjusted under 35 U.S.C. 154(b) by 0 days.

(21) Appl. No.: 14/854,608

(22) Filed: Sep. 15, 2015

(65) Prior Publication Data
US 2016/0013410 A1     Jan. 14, 2016

Related U.S. Application Data

(63) Continuation of application No. PCT/US2014/030404, filed on Mar. 17, 2014.
(Continued)

(51) Int. Cl.
*H01L 21/00* (2006.01)
*H01L 51/00* (2006.01)
(Continued)

(52) U.S. Cl.
CPC ...... *H01L 51/0003* (2013.01); *H01L 51/0004* (2013.01); *H01L 51/0023* (2013.01);
(Continued)

(58) Field of Classification Search
CPC ............ H01L 51/0003; H01L 51/0004; H01L 51/0023; H01L 51/4253; H01L 51/442;
(Continued)

(56) References Cited

U.S. PATENT DOCUMENTS

| | | | |
|---|---|---|---|
| 4,035,197 A | 7/1977 | Raychaudhuri | |
| 4,400,577 A | 8/1983 | Spear | |

(Continued)

FOREIGN PATENT DOCUMENTS

| | | | |
|---|---|---|---|
| CA | 1013262282 A | 8/2013 | |
| CN | 10319011 A | 7/2013 | |

(Continued)

OTHER PUBLICATIONS

Hau et al. Air-stable inverted flexible polymer solar cells using zinc oxide nanoparticles as an electron selective layer. Applied Physics Letters 92, 253301 (2008).

(Continued)

*Primary Examiner* — Thanh T Nguyen
(74) *Attorney, Agent, or Firm* — Robert J. Varkonyi; Smith & Hopen, P.A.

(57) ABSTRACT

An all-spray fabrication method for large scale inverted organic solar array is provided. Zinc oxide sol gel solutions and revised layers shorten the fabrication process from 2 days to 5 hours and concurrently improve transparency and visual effect of solar windows, and improve power conversion efficiency over 2× compared to previous devices, due to enhanced device characteristics like increased shunt resistance and fill factor. The method also eliminates human factors such as manual erasing of active layer to make series connections by providing a complete solution processable manufacturing process. The semi-transparency of the solar module allows for applications on windows and windshields. The inventive modules are more efficient than (Continued)

silicon solar cells in artificial light environments, significantly expanding their use in indoor applications. Additionally, these modules can be integrated into soft fabrics such as tents, military back-packs or combat uniforms, providing a highly portable renewable power supply for deployed military forces.

21 Claims, 9 Drawing Sheets

Related U.S. Application Data

(60) Provisional application No. 61/792,193, filed on Mar. 15, 2013.

(51) Int. Cl.
    *H01L 51/42* (2006.01)
    *H01L 51/44* (2006.01)

(52) U.S. Cl.
    CPC ........ *H01L 51/4253* (2013.01); *H01L 51/442* (2013.01); *H01L 51/0037* (2013.01); *H01L 2251/305* (2013.01); *H01L 2251/308* (2013.01); *Y02E 10/549* (2013.01)

(58) Field of Classification Search
    CPC ......... H01L 2251/305; H01L 2251/308; H01L 51/0037; Y02E 10/549
    See application file for complete search history.

(56) References Cited

U.S. PATENT DOCUMENTS

| | | | |
|---|---|---|---|
| 5,503,285 | A | 4/1996 | Warren |
| 6,054,809 | A | 4/2000 | Haynes et al. |
| 6,417,124 | B1 | 7/2002 | Peuchert et al. |
| 7,495,251 | B2 | 2/2009 | Zhu et al. |
| 7,704,674 | B1 | 4/2010 | Amblard et al. |
| 7,799,990 | B2 | 9/2010 | Marks et al. |
| 8,023,870 | B2 | 9/2011 | Suzuki et al. |
| 8,198,796 | B2 | 6/2012 | Takada |
| 8,263,174 | B2 | 9/2012 | Yagi et al. |
| 2002/0147364 | A1 | 10/2002 | Syvret et al. |
| 2003/0108725 | A1 | 6/2003 | Hamilton et al. |
| 2004/0187917 | A1 | 9/2004 | Pichler |
| 2005/0062174 | A1 | 3/2005 | Ingle |
| 2005/0129857 | A1 | 6/2005 | Pollack et al. |
| 2005/0236614 | A1 | 10/2005 | Parker |
| 2005/0252545 | A1 | 11/2005 | Nowlan et al. |
| 2006/0207646 | A1 | 9/2006 | Terreau et al. |
| 2006/0261314 | A1 | 11/2006 | Lang et al. |
| 2007/0042154 | A1 | 2/2007 | Hancer et al. |
| 2007/0249087 | A1 | 10/2007 | Zhu et al. |
| 2008/0073511 | A1 | 3/2008 | Svatos et al. |
| 2008/0149178 | A1 | 6/2008 | Reyes-Reyes et al. |
| 2008/0223445 | A1 | 9/2008 | Marks et al. |
| 2009/0038683 | A1 | 2/2009 | Walter et al. |
| 2009/0155459 | A1 | 6/2009 | Park et al. |
| 2009/0188551 | A1 | 7/2009 | Hwang |
| 2009/0229667 | A1 | 9/2009 | Shrotriya et al. |
| 2009/0250665 | A1 | 10/2009 | Hsu et al. |
| 2009/0255583 | A1 | 10/2009 | Young et al. |
| 2009/0301544 | A1 | 12/2009 | Minelli |
| 2009/0301556 | A1 | 12/2009 | Kawano et al. |
| 2010/0072462 | A1 | 3/2010 | Brown et al. |
| 2010/0252113 | A1 | 10/2010 | Marks et al. |
| 2010/0282309 | A1 | 11/2010 | Pschirer et al. |
| 2010/0300536 | A1 | 12/2010 | Aitken et al. |
| 2010/0308307 | A1 | 12/2010 | Meerholz et al. |
| 2011/0015427 | A1 | 1/2011 | Hummelen et al. |
| 2011/0056564 | A1 | 3/2011 | Korgel et al. |
| 2011/0073151 | A1 | 3/2011 | Yago |
| 2011/0186112 | A1 | 8/2011 | Aernouts et al. |
| 2012/0035871 | A1 | 2/2012 | Cofta et al. |
| 2012/0156825 | A1 | 6/2012 | Lewis et al. |
| 2013/0048078 | A1* | 2/2013 | Lim ................... H01L 51/0048 136/263 |
| 2013/0263916 | A1 | 10/2013 | Lewis et al. |
| 2013/0280847 | A1 | 10/2013 | Lewis et al. |

FOREIGN PATENT DOCUMENTS

| | | |
|---|---|---|
| JP | 60219522 | 2/1985 |
| JP | 5275728 A | 10/1993 |
| JP | 9501231 A | 2/1997 |
| JP | 2005244159 A | 9/2005 |
| JP | 2006511073 | 3/2006 |
| JP | 2007335203 A | 12/2007 |
| JP | 2008272649 | 11/2008 |
| JP | 2010059417 | 3/2010 |
| WO | 9504284 A2 | 2/1995 |
| WO | 2009114832 A2 | 9/2009 |
| WO | 2011068968 A2 | 6/2011 |
| WO | WO 2012122367 A2 * | 9/2012 ........... H01L 27/301 |

OTHER PUBLICATIONS

International Search Report and Written Opinion issued by the International Searching Authority on Oct. 30, 2012 for related International Patent Application No. PCT/US2012/028255.

International Preliminary Report on Patentability issued by the International Bureau on Sep. 10, 2013 for related International Patent Application No. PCT/US2012/028255.

Restriction Requirement issued by the United States Patent and Trademark Office on Jul. 16, 2015 for related U.S. Appl. No. 14/021,620.

Non-final Office Action issued by the United States Patent and Trademark Office on Dec. 17, 2015 for related U.S. Appl. No. 14/021,620.

Extended Search Report issued by the European Patent Office on Apr. 17, 2015 for related European Patent Application No. 12754451.8-1552.

First Office Action issued by the Chinese State Intellectual Property Office on Aug. 27, 2015 for related Chinese Patent Application No. 201280012365.5.

Notification of First Office Action. English translation of First Office Action issued by the Chinese State Intellectual Property Office on Aug. 27, 2015 for related Chinese Patent Application No. 201280012365.5.

Blankenburg, et al., Reel to reel wet coating as an efficient up-scaling technique for the production of bulk heterojunction polymer solar cells, Sol. Energy Mater. Sol. Cells. Apr. 2009;93(4): 476-483.

Huang, et al., A Semi-transparent plastic solar cell fabricated by a lamination process, Adv. Mater. 20 (2008) 415-419.

Jung and Jo, Annealing-free high efficiency and large area polymer solar cells fabricated by a roller painting process, Adv. Func. Mater. 20 (2010) 2355-2363.

Kim, et al., Performance optimization of polymer solar cells using electrostatically sprayed photoactive layers, Adv. Funct. Mater. Aug. 2010;(20):3538-3546.

Kim, et al., Substrate heated spray-deposition method for high efficient organic solar cell: morphology inspection, Jap. J. Appl. Phys. Jan. 2010;49(1R):01800-01804.

Kline and McGehee, Morphology and charge transport in conjugated polymers, J Macromol. Sci. C: Polym. Rev. 46 (2006) 27-45.

Krebs and Norrman, Using light-induced thermocleavage in a roll-to-roll process for polymer solar cells, ACS Appl. Mater. Interfaces. 2010; 2(3):877-887.

Krebs, et al., A roll-to-roll process to flexible polymer solar cells: model studies, manufacture and operational stability studies, J. Mater. Chem. Aug. 2009;19(30):5442-5451.

Krebs, et al., Large area plastic solar cell modules, Mater. Sci. Eng. B. Mar. 25, 2007;138(2):106-111.

Li, et al., Efficient inverted polymer solar cells, Appl. Phys. Lett. 88 (2006) 253503-253506.

(56) References Cited

OTHER PUBLICATIONS

Lilliedal, et al., the effect of post-processing treatments on inflection points in current-voltage curves of roll-to-roll processed polymer photovoltaics. Solar Energy Materials & Solar Cells. Dec. 2010;94(12)2018-2031.
Lim, et al., Spray-deposited poly(3,4-ethylenedioxythiophene): poly(styrenesulfonate) top electrode for organic solar cells. Appl. Phys. Lett. 2008, 93, 193301.
Lungenschmied, et al., Flexible, long-lived, large-area, organic solar cells, Sol. Energy Mater. Sol. Cells 91 (2007) 379-384.
Mathilde, et al., The effect of post-processing treatments on inflection points in current-voltage curves of roll-to-roll processed polymer photovoltaics, Solar Energy Materials & Solar Cells. Dec. 2010;94 (12)2018-2031.
Niggemann, et al., Organic solar cell modules for specific applications—from energy autonomous systems to large area photovoltaics, Thin Solid Films. Aug. 30, 2008;516(20):7181-7187.
No, et al., Performance of bulk heterojunction solar cells fabricated using spray-deposited poly[[9-(1-octylnonyl)-9H-carbazole-2,7-diyl]-2,5-thiophenediyl-2,1,3-benzothiadiazole-4,7-diyl-2,5-thiophenediyl]/[6,6]-phenyl C71 butyric acid methyl ester blend active layers. Intl J Photoenergy. 2013; Article ID 202467.
Peumans & Forrest, Very-high-efficiency double-heterostructure copper phthalocyanine/C60 photovoltaic cells. Appl. Phys. Lett. 2001;79(1):126-9.
Peumans, et al., Efficient photon harvesting at high optical intensities in ultrathin organic double-heterostructure photovoltaic diodes, Appl. Phys. Lett. 2000;76(19)2650-2652.
Sekine, et al., ZnO nano-ridge structure and its application in inverted polymer solar cell. Org. Electron. Dec. 2009;10(8), 1473-1477.
Shaheen, et al., 2.5% efficient organic plastic solar cells, Appl. Phys. Lett. 78 (2001) 841-843.
Steim, et al., Flexible polymer Photovoltaic modules with incorporated organic bypass diodes to address module shading effects, Sol. Energy Mater Sol. Cells. Nov. 2009;93(11):1963-1967.
Tipnis, et al., Large-area organic photovoltaic module—fabrication and performance, Sol. Energy Mater. Sol. Cells. Apr. 2009;93(4):442-446.
Weickert, et al., Spray-deposited PEDOT:PSS for inverted organic solar cells, Sol. Energy Mater. Sol. Cells 2010;94 (12):2371-2374.
Yu, et al., Efficient inverted solar cells using TiO2 nanotube arrays, Nanotechnology 19 (2008) 255202-255207.
Zhou, et al. Inverted and transparent polymer solar cells prepared with vacuum-free processing, Sol. Eng. Sol. Cells 19 (2009) 497-500.
Zou, et al. Metal grid/conducting polymer hybrid transparent electrode for inverted polymer solar cells, Appl. Phys. Lett 96 (2010) 203301-203304.
Clavier, et al. Differential Power Analysis in the Presence of Hardware Countermeasures, Koc-Paar, LNCS 1965, pp. 252-263, CHES 2000.
Ramakrishnan, et al. SDMLp: On the Use of Complementary Pass Transistor Logic for Design of DPA Resistant Circuits, 2012 IEEE International Symposium on Hardware-Oriented Security and Trust, pp. 31-36.
Attoh-Okine, et al. Security Issues of Emerging Smart Cards Fare Collection Application in Mass Transit, Lehman Center for Transportation Research, Department of Civil Engineering, Florida International University. 0-7803-2587-7/95, 1995 IEEE, pp. 523-526.
Kocher, Paul C. Timing Attacks on Implementations of Diffie-Hellman, RSA, DSS, and Other Systems. N. Koblitz (Ed.): Advances in Cryptology—CRYPTO 1996, LNCS 1109, pp. 104-113.
Kocher, et al. Differential Power Analysis. Michael Wiener (Ed.): CRYPTO 1999, LNCS 1666, pp. 388-397.
Kim et al. Device annealing effect in organic solar cells with blends of regioregular poly(3-hexylthiophene) and soluble fullerene. Applied Physics Letters 86, 063502 (2005).
Kim et al. A strong regioregularity effect in self-organizing conjugated polymer films and high-efficiency polythiophene: fullerene solar cells, Mar. 2006. Nature Materials, vol. 5, pp. 197-203.
Lunt et al. Transparent, near-infrared organic photovoltaic solar cells for window and energy-scavenging applications. Applied Physics Letters 98, 113305 (2011).
Norrman et al. Degradation Patterns in Water and Oxygen of an Inverted Polymer Solar Cell. J. Am. Chem. Soc. 2010, 132, 16883-16892.
English translation of Chinese Patent Application No. CN101661994(A), Jilin University, Mar. 3, 2010.
Steirer et al. Ultrasonically sprayed and injet printed thin film electrodes for organic solar cells. Thin Solid Films 517 (2009) 2781-2786.
Restriction Requirement issued by the United States Patent and Trademark Office on Jul. 7, 2014 for related U.S. Appl. No. 13/854,602.
Final Office Action issued by the United States Patent and Trademark Office on Mar. 11, 2015 for related U.S. Appl. No. 13/854,602.
Non-final Office Action issued by the United States Patent and Trademark Office on Sep. 17, 2014 for related U.S. Appl. No. 13/854,602.
Non-final Office Action issued by the United States Patent and Trademark Office on Oct. 6, 2015 for related U.S. Appl. No. 13/854,602.
Official Action issued by the Japanese Patent Office on Mar. 13, 2014 for related Japanese Patent Application No. 2013-531924.
Notification of Reasons for Refusal. English translation of Official Action issued by the Japanese Patent Office on Mar. 13, 2014 for related Japanese Patent Application No. 2013-531924.
International Search Report and Written Opinion issued by the International Searching Authority on May 4, 2012 for Related International Patent Application No. PCT/US2011/054290.
International Preliminary Report on Patentability issued by the International Bureau on Apr. 11, 2013 for related International Patent Application No. PCT/US2011/054290.
First Office Action issued by the Chinese State Intellectual Property Office on Feb. 28, 2015 for related Chinese Application No. 201180047705.3.
Search Report issued by the Chinese State Intellectual Property Office on Feb. 11, 2015 for related Chinese Application No. 201180047705.3.
Manceau et al. ITO-free flexible polymer solar cells: From small model devices to roll-to-roll processed large modules. Organic Electronics 12 (2011) 566-574.
Nelson, J. Organic photovoltaic film. Current Opinion Solid State and Materials Science 6 (2002) 87-95.
Graupner et al. Shallow and deep traps in conjugated polymers of high intrachain order. Physical Review B, Sep. 15, 1996, vol. 54, No. 11, pp. 7611-7613.
Geiser et al. Poly(3-hexylthiophene)IC60 heterojunction solar cells: Implication of morphology on performance and ambipolar charge collection. Solar Energy Materials & Solar Cells 92 (2008) 464-473.
Waldauf et al. Highly efficient inverted organic photovoltaics using solution based titanium oxide as electron selective contact. Applied Physics Letters 89, 233517 (2006).
Weickert et al. Spray-deposited PEDOT:PSS for inverted organic solar cells. Solar Energy Materials & Solar Cells, 2010, vol. 94:2371-2374.
Van Zant, P. Microchip Fabrication: a Practical Guide to Semiconductor Processing, McGraw-Hill, 2000. 4th Edition. Chapter 14 pp. 431-432.
Yakimov et al. High photovoltage multiple-heterojunction organic solar cells incorporating interfacial metallic nanoclusters. Applied Physics Letters 80, 1667 (2002).
Krebs, F. All solution roll-to-roll processed polymer solar cells free from indium-tin-oxide and vacuum coating steps. Organic Electronics 10 (2009) 761-768.
Van Der Pauw. A Method of Measuring the Resistivity and Hall Coefficient on Lamellae of Arbitrary Shape. Philips Tech. Rev. 1958. vol. 20:220-224.

(56) References Cited

OTHER PUBLICATIONS

Zimmermann et al. ITO-free wrap through organic solar cells—A module concept for cost-efficient reel-to-reel production. Solar Energy Materials & Solar Cells 91 (2007) 374-378.
Boland et al. Investigation of structural, optical, and electrical properties of regioregular poly(3-hexylthiophene)/ fullerene blend nanocomposites for organic solar cells. Thin Solid Films 518 (2010) 1728-1731.
Girotto et al. Exploring spray coating as a deposition technique for the fabrication of solution-processed solar cells. Solar Energy Materials & Solar Cells 93 (2009) 454-458.
Green et al. Performance of bulk heterojunction photovoltaic devices prepared by airbrush spray deposition. Applied Phyisics Letters 92, 033301 (2008).
Lewis et al. Over 30% transparency large area inverted organic solar array by spray. Solar Energy Materials & Solar cells 95 (2011) 2816-2822.
Reese et al. Pathways for the degradation of organic photovoltaic P3HT.PCBM based devices. Solar Energy Materials & Solar Cells 92 (2008) 746-752.
Non-final Office Action issued by the United States Patent and Trademark Office on Nov. 20, 2014 for related U.S. Appl. No. 13/907,416.
Official Action issued by the Japanese Patent Office on Jun. 11, 2014 for related Japanese Patent Application No. 2013-553654.
Notification of Reasons for Refusal. English translation of Official Action issued by the Japanese Patent Office on Jun. 11, 2014 for related Japanese Patent Application No. 2013-553654.
International Search Report and Written Opinion issued by the International Searching Authority on Sep. 28, 2012 for related International Patent Application No. PCT/US2012/025028.
International Preliminary Report on Patentability issued by the International Bureau on Aug. 29, 2013 for related International Patent Application No. PCT/US2012/025028.
First Office Action issued by the Chinese State Intellectual Property Office on Jul. 6, 2015 for related Chinese Patent Application No. 201280004152.8.
Notification of First Office Action. English translation of First Office Action issued by the Chinese State Intellectual Property Office on Jul. 6, 2015 for related Chinese Patent Application No. 201280004152.8.
Second Office Action issued by the Chinese State Intellectual Property Office on Mar. 3, 2016 for related Chinese Patent Application No. 201280004152.8.
Notification of Second Office Action. English translation of First Office Action issued by the Chinese State Intellectual Property Office on Mar. 3, 2016 for related Chinese Patent Application No. 201280004152.8.
Kim et al. Control of the electrode work function and active layer morphology via surface modification of indium tin Oxide for high efficiency organic photovoltaics. Applied Physics Letters 91, 112111 (2007).
Kim et al. The effect of introducing a buffer layer to polymer solar cells on cell efficiency. Solar Energy Materials & Solar Cells 95 (2011) 1119-1122.
Hains et al. Anode Interfacial Tuning via Electron-Blocking/Hole-Transport Layers and Indium Tin Oxide Surface Treatment in Bulk-Heterojunction Organic Photovoltaic Cells. Adv. Funct. Mater. 2010, 20, 595-606.
Chen et al. Light Harvesting Schemes for High-performance Polymer Solar Cells. Advances in Optoelectronics and Micro/Nano-Optics (AOM), 2010 OSA-IEEE-COS, pp. 1-4.
Girotto et al. High-Performance Organic Solar Cells with Spray-Coated Hole-Transport and Active Layers. Adv. Funct. Mater. 2011, 21, 64-72.
Delta Technologies, LTD. Corning Boro-Aluminosilicate Glass Products. http://web.archive.org/web/20090427102814/http://www.delta-technologies.com/product. Nov. 19, 2014.
Hau et al. Spraycoating of silver nanoparticle electrodes for inverted polymer solar cells. Organic Electronics 10 (2009) 719-723.

International Search Report and Written Opinion issued by the International Searching Authority on Sep. 27, 2012 for related International Patent Application No. PCT/US2012/023491.
International Preliminary Report on Patentability issued by the International Bureau on Aug. 15, 2013 for related International Patent Application No. PCT/US2012/023491.
Official Action issued by the Canadian Intellectual Property Office on May 19, 2015 for related Canadian Patent Application No. 2,819,899.
First Office Action issued by the Chinese State Intellectual Property Office on Jul. 1, 2015 for related Chinese Patent Application No. 201280004163.6.
Notification of the First Office Action. English translation of First Office Action ssued by the Chinese State Intellectual Property Office on Jul. 1, 2015 for related Chinese Patent Application No. 201280004163.6.
Second Office Action issued by the Chinese State Intellectual Property Office on Mar. 2, 2016 for related Chinese Patent Application No. 201280004163.6.
Notification of the Second Office Action. English translation of Second Office Action ssued by the Chinese State Intellectual Property Office on Mar. 2, 2016 for related Chinese Patent Application No. 201280004163.6.
Final Office Action issued by the United States Patent and Trademark Office on Apr. 15, 2015 for related U.S. Appl. No. 13/907,397.
Non-final Office Action issued by the United States Patent and Trademark Office on Nov. 24, 2014 for related U.S. Appl. No. 13/907,397.
Non-final Office Action issued by the United States Patent and Trademark Office on Dec. 4, 2015 for related U.S. Appl. No. 13/907,397.
Aernouts et al., Polymer based organic solar cells using ink-jet printed active layers, Applied Physics Letters 92, 033306, 2008.
Dennler et al., Flexible Conjugated Polymer-Based Plastic Solar Cells: From Basics to Applications, Proceedings of the IEEE, vol. 93, No. 8, Aug. 2005, pp. 1429-1439.
Green et al., Solar Cell Efficiency Tables (Version 32), Prog. Photovolt: Res. Appl., 2008, 16:435-440.
Krebs, Fabrication and processing of polymer solar cells:a review of printing and coating techniques, Solar Energy Materials & Solar Cells, vol. 93, 2009, pp. 394-412.
Lewis et al., Fabrication of organic solar array for applications in microelectromechanical systems, Journal of Renewable and Sustainable Energy 1, vol. 1, 2009, pp. 1-8.
Liang et al., Development of New Semiconducting Polymers for High Performance Solar Cells, J. Am. Chem. Soc. vol. 131, 2009, pp. 56-57.
Ma et al., Thermally Stable, Efficient Polymer Solar Cells with Nanoscale Control of the Interpenetrating Network Morphology, Advanced Functional Materials, vol. 15, 2005, pp. 1617-1622.
Shaheen et al., Fabrication of bulk heterojunction plastic solar cells by screen printing, Applied Physics Letters, 79 (18), 2996, 2001.
Yu et al., Polymer Photovoltaic Cells: Enhanced Efficiencies via a Network of Internal Donor-Acceptor Heterojunctions, Science, vol. 270, 1995, pp. 1789-1791.
First Office Action issued by the Chinese State Intellectual Property Office on Jul. 21, 2014 for related Chinese Application No. 201080055146.6.
Second Office Action issued by the Chinese State Intellectual Property Office on Feb. 17, 2015 for related Chinese Application No. 20108005146.6.
Extended European Search Report issued by the European Patent Office on Jul. 7, 2014 for related European Patent Application No. 10835123.0.
International Preliminary Report on Patentability issued by the International Bureau on Aug. 12, 2011 for related International Patent Application No. PCT/US2010/058732.
International Preliminary Report on Patentability issued by the International Bureau on Oct. 27, 2014 for related International Patent Application No. PCT/US2014/041535.
International Search Report and Written Opinion issued by the International Searching Authority on Aug. 12, 2011 for related International Patent Application No. PCT/US2010/058732.

(56) References Cited

OTHER PUBLICATIONS

International Search Report and Written Opinion issued by the International Searching Authority on Oct. 27, 2014 for related International Patent Application No. PCT/US2014/041535.
Official Action issued by the Japanese Patent Office on Apr. 18, 2014 for related Japanese Patent Application No. 2012-542187.
Notification of Reasons for Refusal. English translation of Official Action issued by the Japanese Patent Office on Apr. 18, 2014 for related Japanese Patent Application No. 2012-542187.
Final Office Action issued by the United States Patent and Trademark Office on Feb. 15, 2013 for related U.S. Appl. No. 13/400,352.
Non-final Office Action issued by the United States Patent and Trademark Office on Oct. 17, 2012 for related U.S. Appl. No. 13/400,352.

\* cited by examiner

MASK-STACK-SHIFT METHOD TO FABRICATE ORGANIC SOLAR ARRAY BY SPRAY

CROSS-REFERENCE TO RELATED APPLICATIONS

This is a continuation of and claims priority to International Patent Application No. PCT/US2014/030404, filed Mar. 17, 2014 which claims priority to U.S. Provisional Patent Application No. 61/792,193, entitled, "Mask-Stack-Shift Method to Fabricate Organic Solar Array by Spray", filed Mar. 15, 2013, the contents of which are herein incorporated by reference.

FIELD OF THE INVENTION

This invention relates to spray-manufactured organic solar photovoltaic cell. Specifically, the invention provides a novel method of manufacturing organic solar photovoltaic cells using spray-deposition and the organic solar photovoltaic cell resulting therefrom.

BACKGROUND OF THE INVENTION

In recent years, energy consumption has drastically increased, due in part to increased industrial development throughout the world. The increased energy consumption has strained natural resources, such as fossil fuels, as well as global capacity to handle the byproducts of consuming these resources. Moreover, future demands for energy are expected in greatly increase, as populations increase and developing nations demand more energy. These factors necessitate the development of new and clean energy sources that are economical, efficient, and have minimal impact on the global environment.

Photovoltaic cells have been used since the 1970s as an alternative to traditional energy sources. Because photovoltaic cells use existing energy from sunlight, the environmental impact from photovoltaic energy generation is significantly less than traditional energy generation. Most of the commercialized photovoltaic cells are inorganic solar cells using single crystal silicon, polycrystal silicon or amorphous silicon. Traditionally, solar modules made from silicon are installed on rooftops of buildings. However, these inorganic silicon-based photovoltaic cells are produced in complicated processes and at high costs, limiting the use of photovoltaic cells. These silicon wafer-based cells are brittle, opaque substances that limit their use, such as on window technology where transparency is a key issue. Further, installation is an issue since these solar modules are heavy and brittle. In addition, installation locations, such as rooftops, are limited compared to the window area in normal buildings, and even less in skyscrapers. To solve such drawbacks, photovoltaics cell using organic materials have been actively researched.

The photovoltaic process in OPV first starts from the absorption of light mainly by the polymer, followed by the formation of excitons. The exciton then migrates to and dissociates at the interface of donor (polymer)/acceptor (fullerene). Separated electrons and holes travel to opposite electrodes via hopping, and are collected at the electrodes, resulting in an open circuit voltage ($V_{oc}$). Upon connection of electrodes, a photocurrent (short circuit current, $I_{sc}$) is created.

Organic photovoltaic cells based on π-conjugated polymers have been intensively studied following the discovery of fast charge transfer between polymer and carbon $C_{60}$. Conventional organic photovoltaic devices use transparent substrates, such as an indium oxide like indium tin oxide (ITO) or IZO, as an anode and aluminum or other metal as a cathode. A photoactive material including an electron donor material and an electron acceptor material is sandwiched between the anode and the cathode. The donor material in conventional devices is poly-3-hexylthiophene (P3HT), which is a conjugated polymer. The conventional acceptor material is (6,6)-phenyl $C_{61}$ butyric acid methylester (PCBM), which is a fullerene derivative. Both the ITO and aluminum contacts use sputtering and thermal vapor deposition, both of which are expensive, high vacuum, technologies. In these photovoltaic cells, light is typically incident on a side of the substrate requiring a transparent substrate and a transparent electrode. However, this limits the materials that may be selected for the substrate and electrode. Further, a minimum thickness of 30 to 500 nm is needed to increase conductivity. Moreover, the organic photoelectric conversion layer is sensitive to oxygen and moisture, which reduce the power conversion efficiency and the life cycle of the organic solar cell. Development of organic photovoltaic cells, has achieved a conversion efficiency of 3.6% (Peumans & Forrest, Very-high-efficiency double-heterostructure copper phthalocyanine/$C_{60}$ photovoltaic cells. Appl. Phys. Lett. 2001; 79(1):126-9).

These polymeric OPVs hold promise for potential cost-effective photovoltaics since it is solution-processable. Large area OPVs have been demonstrated using printing (Krebs and Norrman, Using light-induced thermocleavage in a roll-to-roll process for polymer solar cells, ACS Appl. Mater. Interfaces. 2010; 2(3):877-887; Krebs, et al., A roll-to-roll process to flexible polymer solar cells: model studies, manufacture and operational stability studies, J. Mater. Chem. August 2009; 19(30):5442-5451; Krebs, et al., Large area plastic solar cell modules, Mater. Sci. Eng. B. 25 March 2007; 138(2):106-111; Steim, et al., Flexible polymer Photovoltaic modules with incorporated organic bypass diodes to address module shading effects, Sol. Energy Mater. Sol. Cells. November 2009; 93(11):1963-1967; Blankenburg, et al., Reel to reel wet coating as an efficient up-scaling technique for the production of bulk heterojunction polymer solar cells, Sol. Energy Mater. Sol. Cells. April 2009; 93(4): 476-483), spin-coating and laser scribing (Niggemann, et al., Organic solar cell modules for specific applications—from energy autonomous systems to large area photovoltaics, Thin Solid Films 30 Aug. 2008; 516(20):7181-7187; Tipnis, et al., Large-area organic photovoltaic module—fabrication and performance, Sol. Energy Mater. Sol. Cells. April 2009; 93(4):442-446; Lungenschmied, et al., Flexible, long-lived, large-area, organic solar cells, Sol. Energy Mater. Sol. Cells 91 (2007) 379-384), and roller painting (Jung and Jo, Annealing-free high efficiency and large area polymer solar cells fabricated by a roller painting process, Adv. Func. Mater. 20 (2010) 2355-2363). ITO, a transparent conductor, is commonly used as a hole collecting electrode (anode) in OPV, and a normal geometry OPV starts from the ITO anode, with the electron accepting electrode (cathode) usually a low work function metal such as aluminum or calcium, being added via thermal evaporation process.

In addition, to improve efficiency of the organic thin film solar cell, photoactive layers were developed using a low-molecular weight organic material, with the layers stacked and functions separated by layer. (Peumans, et al., Efficient photon harvesting at high optical intensities in ultrathin organic double-heterostructure photovoltaic diodes, Appl. Phys. Lett. 2000; 76(19):2650-2652). Alternatively, the photoactive layers were stacked with a metal layer of about 0.5 to 5 nm interposed to double the open end voltage ($V_{oc}$). (Yakimov & Forrest, High photovoltage multiple-heterojunction organic solar cells incorporating interfacial metallic nanoclusters, Appl. Phys. Lett. 2002; 80(9):1667-1669). As described above, stacking of photoactive layer is one of the most effective techniques for improving efficiency of the organic thin film solar cell. However, stacking photoactive layers can cause layers to melt due to solvent formation from the different layers. Stacking also limits the transparency of the photovoltaic. Interposing a metal layer between the photoactive layers can prevent solvent from one photoactive layer from penetrating into another photoactive layer and preventing damage to the other photoactive layer. However, the metal layer also reduces light transmittance, affecting power conversion efficiency of the photovoltaic cell.

In order for solar cells to be compatible with windows, issues with the transparency of the photovoltaic must first be addressed. The metal contacts used in traditional solar modules are visibility-blocking and must be replaced. Another challenge is to reduce cost for large scale manufacturing in order for organic solar cells to be commercially viable, a much lower manufacturing cost to compensate for the lower efficiency than current photovoltaic products. For example, a solution-based all-spray device, which was opaque, showed a PCE as high as 0.42% (Lim, et al., Spray-deposited poly(3,4-ethylenedioxythiophene):poly(styrenesulfonate) top electrode for organic solar cells, Appl. Phys. Lett. 2008; 93(19):193301-193304). Large-scale manufacturing techniques, such as printing, have lowered the cost of manufacture, but still involve the use of metal in certain way, and therefore affect the transparency of the photovoltaic cell.

Therefore, what is needed is a new method of manufacturing organic photovoltaic cells without the use of metal, to allow for novel photovoltaic cells with enhanced transparency, and with minimal human involvement transparency and visual effect of solar window to reduce variation and damage during manufacturing. The art at the time the present invention was made did not describe how to attain these goals, of manufacturing less expensive and less complex devices, having enhanced transparency.

BRIEF SUMMARY OF THE INVENTION

A methodology is disclosed for manufacturing an all-spray organic solar photovoltaic cell using a stack of mask system to eliminate the wiping process required in previous manufacturing methods, which removes one of the major hurdles associated with human factors, namely inconsistent manufacturing. The inventive method has solved the costly and complicated process currently used to make crystalline and thin film solar cells, namely, high-vacuum, high temperature, low rate and high-cost manufacturing, and permits its use on any type of substrate including cloth and plastic. Furthermore, this technology could be used on any type of substrate including cloth and plastic. This new technology enables use of all-solution processable organic solar panels with transparent contacts.

The organic solar photovoltaic cell comprises a substrate having a first face and a second face. The substrate may be any material known in the art for use as a photovoltaic substrate. Exemplary materials include cloth, such as nylon cloth, cotton cloth, polyester cloth, hemp cloth, bamboo cloth, glass, such as a low alkaline earth boro-aluminosilicate glass, and plastic. Useful glass is known in the art, and may include glass having a nominal sheet resistance of 4-10 Ohm/square. The substrate may be glass dimensioned into 4"×4" substrates. Exemplary plastics include a polymer, such as acrylonitrile butadiene styrene (ABS), acrylic (PMMA), cyclic olefin copolymer (COC), ethylene-vinyl acetate (EVA), ethylene vinyl alcohol (EVOH), fluoroplastics, such as PTFE, FEP, PFA, CTFE, ECTFE, and ETFE, Kydex (an acrylic/PVC alloy), liquid crystal polymer (LCP), polyoxymethylene (POM or Acetal), polyacrylates (acrylic), polyacrylonitrile (PAN or acrylonitrile), polyamide (PA or nylon), polyamide-imide (PAI), polyaryletherketone (PAEK or ketone), polybutadiene (PBD), polybutylene (PB), polychlorotrifluoroethylene (PCTFE), polycyclohexylene dimethylene terephthalate (PCT), polycarbonate (PC), polyhydroxyalkanoates (PHAs), polyketone (PK), polyester, polyetherketoneketone (PEKK), polyetherimide (PEI), polyethersulfone (PES), chlorinated polyethylene (CPE), polyimide (PI), polymethylpentene (PMP), polyphenylene oxide (PPO), polyphenylene sulfide (PPS), polypropylene (PP), polystyrene (PS), polysulfone (PSU), polytrimethylene terephthalate (PTT), polyurethane (PU), polyvinyl acetate (PVA), styrene-acrylonitrile (SAN).

An indium oxide layer was patterned onto the first face of the substrate, forming an anode. For example, an ITO layer was optionally patterned using a spray mask and spraying photoresist onto the substrate. The indium oxide layer photoresist was optionally sprayed using an airbrush set to a pressure between 10 and 40 psi. The ITO layer was then etched, such as by using a solution of HCl and $HNO_3$. Etching may be performed at between 90° C. and 130° C. The etched indium oxide layer was optionally cleaned. Non-limiting examples of cleaning include sonification in trichloroethylene, acetone, isopropanol, UV-Ozone treatment, and combinations thereof. The cleaned indium oxide layer was optionally annealed at 145° C. for 4 minutes and cleaned. Examples of cleaning the annealed layer include ozone.

An electron transport layer (ETL) layer of sol-gel ZnO was spray applied to the anode. In some variations, the ZnO layer was prepared based on a sol-gel method of Sekine, et al. (Sekine, et al., ZnO nano-ridge structure and its application in inverted polymer solar cell. Org. Electron. December 2009; 10(8), 1473-1477), heavily modified for the process and the large scale. A sol-gel zinc oxide precursor solution was formed, by for example dissolving zinc acetate in a solution of 2-methoxyethanol and ethanolamine. Alternatively, methoxyethoxyacetic acid may be used (See Lilliedal, et al., The effect of post-processing treatments on inflection points in current-voltage curves of roll-to-roll processed polymer photovoltaics. Solar Energy Materials & Solar Cells. December 2010; 94(12):2018-2031). In some variations, the sol gel zinc oxide precursor solution is stirred and heated at 60° C. for 1 hour prior to spraying. Optionally, the indium oxide layer was covered with a mask or tape prior to spraying the ZnO layer. For example, by masking the edges of the substrate, and applying a patterned mask to the upper face of the substrate. The sol-gel zinc oxide precursor solution was then applied onto the etched indium oxide substrate to form a layer of zinc oxide by spray coating. For example, the sol-gel zinc oxide precursor solution was optionally spray-coated onto the indium oxide substrate using an airbrush, and may be sprayed on at a distance of between 8 cm and 14 cm from the substrate face. Further, the sol-gel zinc oxide precursor solution was optionally spray-coated using a carrier gas pressure of 20 psi. In some embodiments, the sol-gel zinc oxide precursor solution was spray-coated using a volumetric flow rate of between 0.05 mL/min and 0.2 mL/min. Application of the zinc oxide precursor solution can be performed by means known in the art. For example, ZnO can be then spray-coated using an airbrush with overlapping spraying offset by between 0.4 cm and 0.6 cm. After application of the ZnO layer, the mask, tape, or combination was optionally removed from the edges of the substrate.

The zinc oxide layer was then optionally annealed, such as at 275° C. for 6 min, followed by an optional cooling step for 30 min. In some embodiments, the zinc oxide layer was then washed, by rinsing the zinc oxide-coated substrate with deionized $H_2O$ and drying the substrate dry with $N_2$. The zinc oxide-coated substrate was then rinsed with acetone and dried again with $N_2$, followed by a rinse with isopropanol, and drying with $N_2$.

The zinc oxide layer was covered by an active layer of a bulk heterojunction composition. In some embodiments of the invention, the active layer was applied by masking the edges of the substrate, and applying a patterned mask to the upper face of the substrate. A solution of the bulk heterojunction composition solution was optionally heated to 90° C. prior to spraying. The spraying was optionally performed at a distance of between 8 cm and 14 cm from the substrate face. The airbrush was optionally set to a pressure of 20 psi using an inert gas and a volumetric flow rate of the solution of 0.4 mL/min to 0.9 mL/min. The application of the active layer was performed at a temperature of 90° C., which improves the active layer nanomorphology and thus helped to improve final device performance. In some variations, the active layer solution was then spray-coating the substrate using an airbrush with overlapping spraying offset by between 1.2 cm and 0.6 cm. Finally, any optionally masking was removed from the edges of the substrate.

The active layer optionally of had a layer thickness of about 130 nm to about 200 nm, such as about 130 nm or about 200 nm. In specific examples, the bulk heterojunction composition was prepared using poly(3-hexylthiophene) and phenyl-C60-butyric acid-methyl ester. Optionally, the poly(3-hexylthiophene) and phenyl-C60-butyric acid—methyl ester were each dissolved in a separate solution of dichlorobenzene, and mixed at a weight ratio of 1:1. In a non-limiting example, the poly(3-hexylthiophene) was dissolved in dichlorobenzene at a concentration of 20 mg/mL, and the phenyl-C60-butyric acid-methyl in dichlorobenzene dissolved at a concentration of 20 mg/mL. The poly(3-hexylthiophene) solution and the phenyl-C60-butyric acid-methyl solution were then stirred overnight on a hot plate at 60° C. After the initial stirring, the poly(3-hexylthiophene) solution and the phenyl-C60-butyric acid-methyl solution were mixed together at a 1:1 volume ratio and stirred for at least one hour. The preparation time of active solution was reduced from 24 hr to 1 hr for stirring prior to spray process, thereby significantly reducing the fabrication time for the array from 2 days to less than 8 hrs.

An anodic layer of poly (3,4) ethylenedioxythiophene:poly-styrenesulfonate was applied over the active layer. A solution of poly (3,4) ethylenedioxythiophene:poly-styrenesulfonate was optionally filtered, such as using a 0.45 micrometer filter, and mixed with 5 vol. % of dimethylsulfoxide. In a non-limiting example, the final solution composition was 5% DMSO, 95% poly(3,4-ethylenedioxythiophene) poly(styrenesulfonate). The resulting solution was then sonicated for 1 hour.

In some embodiments, the poly (3,4) ethylenedioxythiophene:poly-styrenesulfonate layer was prepared by aligning with the left edge of a first organic photovoltaic cell with the right edge of an active layer of a second organic photovoltaic cell. The poly (3,4) ethylenedioxythiophene:poly-styrenesulfonate layer was optionally applied by fixing a patterned mask to the upper face of the substrate. The active layer solution was then spray-coated on the substrate using an airbrush. Optionally, the poly (3,4) ethylenedioxythiophene:poly-styrenesulfonate mixed with 5 vol. % of dimethylsulfoxide is sprayed at a distance of 3 cm to 7 cm from the substrate surface using an airbrush set to a pressure of 20 psi using an inert gas and a volumetric flow rate of the solution of 0.05 mL/min to 0.1 mL/min. In specific variations, the layer was applied using an overlapping spraying offset by between 0.4 cm and 0.3 cm. Finally, any optional masking was removed from the edges of the substrate.

The organic photovoltaic cell was then placed into high vacuum for 1 h, such as at $10^{-6}$ Torr, and annealed. The annealing was optionally performed by heating the organic solar photovoltaic cell to a temperature of 150° C., and cooling the organic solar photovoltaic cell to room temperature. In specific variations, the device was maintained at the annealing temperature for 8 min, prior to cooling.

Finally, an electrodic material, such as silver, was applied to the solar photovoltaic cell array to form at least one contact in electrical communication with the active layer. The photovoltaic cells may also be in electrical connection, thereby forming an array. For example, a series of organic solar photovoltaic cells disposed into an array of 50 individual cells having active area of 12 $mm^2$. The array comprises 10 cells disposed in series in one row, and 5 rows in parallel connection in some variations.

In the preceding methods, the layers were optionally applied using a 'serpentine' spray pattern movement.

This system has smaller cell occupancy (~20% less), however it provides improved transparency and visual effect of a solar window. Most importantly, the resulting photovoltaic showed an improved power conversion efficiency of more than 2× comparing with the previous method, due to enhanced device characteristics such as increased shunt resistance and fill factor.

A solar cell's efficiency is determined by reflectance efficiency, thermodynamic efficiency, charge carrier separation efficiency and conductive efficiency. Several parameters determine the performance of a solar cell, namely, the open-circuit voltage ($V_{oc}$), defined as the maximum available voltage from the device when no current is flowing, short-circuit current ($I_{sc}$), defined as the current flowing when the voltage is zero, and the fill factor (FF), defined as the ratio of the maximum power from the solar cell to the product of $V_{oc}$ and $I_{sc}$. The overall power conversion efficiency η is defined as $\eta=(FF)*(I_{sc} V_{oc})/P_m$. These parameters are affected by the structure and composition of the device. For example, low shunt resistance provides an alternate current path for the light-generated current, thereby reducing the amount of current flowing through the solar cell junction and the voltage from the solar cell, which is more severe at low-light levels or where less current is generated.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
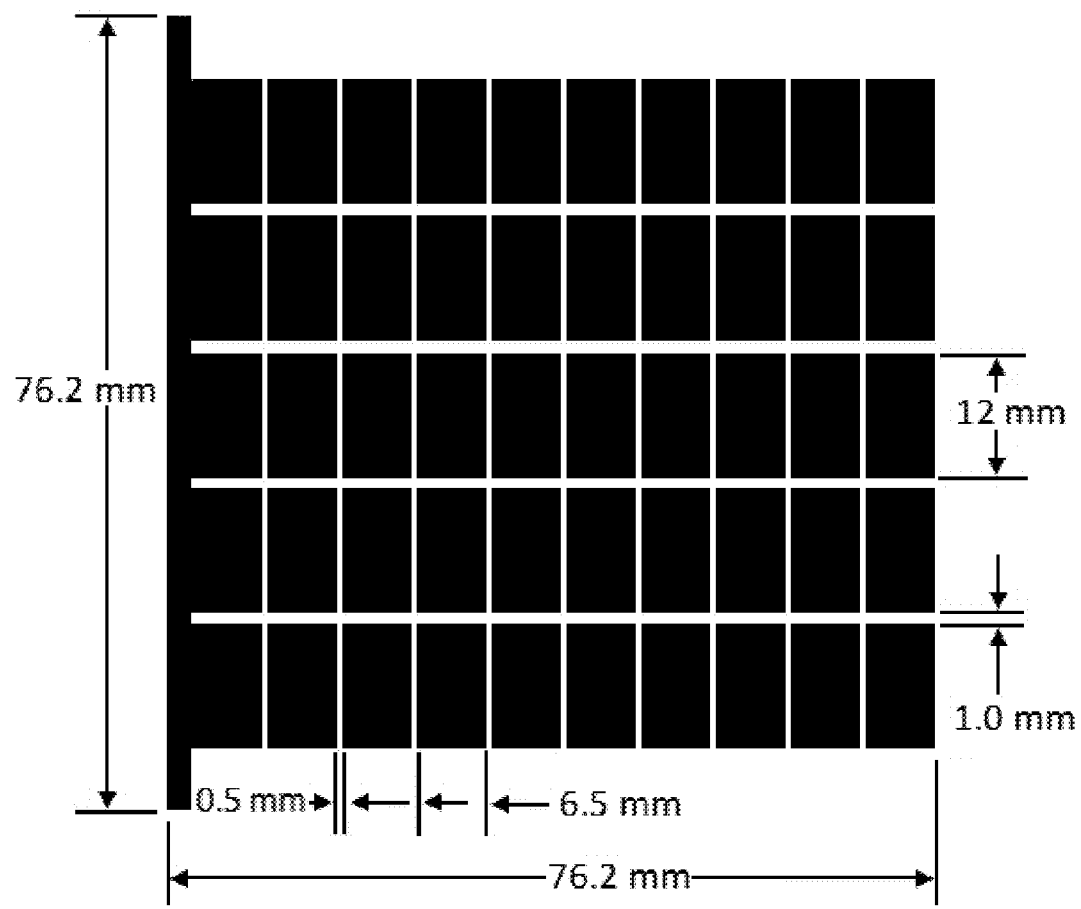
FIG. 1 is a top-down illustration of the device architecture of an inverted array showing the pattern of the ITO-coated substrate.

The present invention for the fabrication of a see-through organic solar array via mask-stack-shift spray may be understood more readily by reference to the following detailed description of the preferred embodiments of the invention and the Examples included herein. However, before the present compounds, compositions, and methods are disclosed and described, it is to be understood that this invention is not limited to specific compounds, specific conditions, or specific methods, etc., unless stated as such. Thus, the invention may vary, and the numerous modifications and variations therein will be apparent to those skilled in the art. It is also to be understood that the terminology used herein is for the purpose of describing specific embodiments only and is not intended to be limiting.

OPV single cell utilizing spray technique has been previously reported (Weickert, et al., Spray-deposited PEDOT: PSS for inverted organic solar cells, Sol. Energy Mater. Sol. Cells 2010; 94(12):2371-2374; Kim, et al., Performance optimization of polymer solar cells using electrostatically sprayed photoactive layers, Adv. Funct. Mater. August 2010; (20):3538-3546; Kim, et al., Substrate heated spray-deposition method for high efficient organic solar cell: morphology inspection, Jap. J. Appl. Phys. January 2010; 49(1R):01800-01804). All-spray was suggested by Lewis, et al. (Ser. No. 13/854,602, filed on Apr. 1, 2013) and Lewis, et al. (U.S. application Ser. No. 13/919,533, filed on Jun. 17, 2013).

As used herein, "about" means approximately or nearly and in the context of a numerical value or range set forth means±15% of the numerical.

As used herein, "substantially" means largely if not wholly that which is specified but so close that the difference is insignificant.

As used herein, "significantly enhanced" means improvement of at least 30% or higher. Examples include a 35% improvement, 40% improvement, 45% improvement, 50% improvement, 55% improvement, 60% improvement, 65% improvement, 70% improvement, 75% improvement, 80% improvement, 85% improvement, 90% improvement, 95% improvement, or 100% improvement.

As used herein, "annealing" refers to solvent annealing and thermal anneal, unless otherwise specified. "Solvent annealing" is a process where an organic layer which has been deposited by spray coating, or other means utilizing a solvent to transfer the organic layer substituents to the organic photovoltaic cell, is permitted to solidify at a controlled and slow rate to enhance the self-organization of the substituents in the polymer film. Such annealing may be achieved by dissolving the organic polymer(s) in a high boiling solvent, like dichlorobenzene, trichlorobenzene, or trichloroethylene, and spray coated onto the photovoltaic. The layer is permitted to slowly dry, i.e. the solvent to evaporate, over a predetermined solidification time, such as 20 minutes to 1 hour. Longer solidification times typically result in increased efficiency of the photovoltaic conversion. "Thermal annealing" is a process whereby a substrate with at least one deposited layer are subjected to thermal energy, i.e. heating, by placing the substrate on a hot plate, oven, thermal lamp, or other heat source for a predetermined period of time and at a predetermined temperature. The temperature is referred to as the annealing temperature while the time period of time is referred to as the annealing time, or provided as a time with the annealing temperature.

Additives may optionally be included to enhance carrier mobility, such as by adding a small amount of a poor solvent with respect to the organic layer substituent, such as an alkanedithiol or nitrobenzene, to the dominant solvent, like chlorobenzene. Such solvent mixtures have been shown to improve polymer aggregation and crystallinity in some polymer systems, thereby enhancing carrier mobility. Alternatively, one or more electrolytes and/or salts is added to the organic layer substituent blend solution, which has been shown to improve photocurrent in the polymer photovoltaic cell. Examples of salts include $NaCl$, $KNO_3$, $MgCl_2$, $CH_3COONa$, $HClO_3$, $CaCl_2$, $((CH_3)_3Si)_2NLi$, $NaNO_3$, $CH_3COONa$, $CuSO_4$, $KCl$, $Mg(NO_3)_2$, $LiCl$, $Na_2CO_3$, $K_2CO_3$, $CaCO_3$, $NaHCO_3$, $NH_4C_2H_3O_2$, $AgNO_3$, $NH_4NO_3$, and $FeCl_3$. Exemplary acidic electrolytes include $HClO_4$, $HI$, $HBr$, $HCl$, $H_2SO_4$, $HNO_3$, $HClO_3$, $HBrO_3$, $HBrO_4$, $HIO_4$, $HSbF_6$, $FSO_3HSbF_5$, $H(CHB_{11}Cl_{11})$, $FSO_3H$, and $CF_3SO_3H$. Exemplary electrolytic bases include $KOH$, $Ba(OH)_2$, $CsOH$, $NaOH$, $Sr(OH)_2$, $Ca(OH)_2$, $RbOH$, $Mg(OH)_2$, $C_6H_{14}LiN$, $NaNH_2$, $NaH$, $((CH_3)_3Si)_2NLi$.

As used herein, "indium oxide" refers to an oxide or hydroxide of indium, such as $In_2O_3$. Examples of indium oxides include indium tin oxide (ITO), chromium-doped indium oxide (Payne & Marquis, Three-Dimensional Spatial Distribution of Cr atoms in Doped Indium Oxide. Chem. Mater., February 2011; 23 (5): 1085-1087), indium zinc oxide, molybdenum doped indium oxide (Rozati & Bargebidi, Characterization of molybdenum-doped indium oxide thin films by spray pyrolysis technique. Bull. Mater. Sci., Vol. 36, No. 4, August 2013, pp. 553-558; Yosida, et al., High-mobility, sputtered films of indium oxide doped with molybdenum. Appl Phys Ltts. March 2004; 84(12):2097), hydrogen-doped indium oxide (IO:H, Baraud, et al., Hydrogen-doped indium oxide/indium tin oxide bilayers for high-efficiency silicon heterojunction solar cells. Solar Energy Mat. Solar Cells. August 2013; 115:151-156), copper-doped indium oxide, titanium-doped indium oxide (ITiO, Panyata, et al., Preparation of Titanium-doped Indium Oxide Films by Ultrasonic Spray Pyrolysis Method. Ferroelectrics. December 2013; 454(1):63-69), cobalt-doped indium oxide (Subías, et al., Local structure study of Co-doped indium oxide and indium-tin oxide thin films using x-ray absorption spectroscopy. Phys. Rev. B. March 2009; 79(9): 094118-5) magnesium-doped indium oxide (Song, et al., Low resistance and reflective Mg-doped indium oxide-Ag ohmic contacts for flip-chip light-emitting diodes. Photonics Technology Letters, IEEE. June 2004; 16(6):1450-2), fluorine-doped indium zinc oxide (IZO:F, Ibrahim, et al., High Transparency Iron Doped Indium Oxide ($In_{2-x}Fe_xO_3$, x=0.0, 0.05, 0.25, 0.35 and 0.45) Films Prepared by the Sol-gel Method. Sains Malaysiana. 2013; 42(7):961-6), fluorine-doped indium zinc oxide (IZO:F, Seo, et al., Solution-processed flexible fluorine-doped indium zinc oxide thin-film transistors fabricated on plastic film at low temperature. Scientific Reports. June 2013; 3: Article number 2085), and gallium-doped indium oxide (GIO, Lim, et al., Highly transparent and low resistance gallium-doped indium oxide contact to p-type GaN. Appl Phys Ltts. July 2005; 87:042109).

As used herein, "high vacuum" refers to negative pressures as provided in Table 1. A nonlimiting example of such negative pressure is $10^{-3}$ mTorr ($10^{-6}$ Torr).

TABLE 1

Pressure values for various vacuum states.

| | Pressure (Torr) | Pressure (Pa) |
|---|---|---|
| atmospheric pressure (no vacuum) | 760 | $1.013 \times 10^6$ |
| low vacuum | 760 to 25 | $1.0 \times 10^6$ to $3 \times 10^3$ |
| medium vacuum | 25 to $1 \times 10^{-3}$ | $3 \times 10^3$ to $1.0 \times 10^{-3}$ |
| high vacuum | $1 \times 10^{-3}$ to $1 \times 10^{-9}$ | $1.0 \times 10^{-3}$ to $1.0 \times 10^{-6}$ |

As used herein "bulk heterojunction composition" refers to a composition of dissimilar crystalline semiconductors mixed together, forming a polymer blend. The first semiconductor is an electron donor and the second is an electron acceptor, with each having unequal band gaps. Light generates excitons in the electron donor, and the charge formed is transported to the device's electrodes. The separation or aggregation of the various layers can be controlled using solvents that evaporate at a rate to form the desired structure. For example, slower evaporation, through use of as chlorobenzene (CB) or dichlorobenzene (DCB), permits more vertical separation or aggregation. Additives may be included to reduce the rate of evaporation, thereby forming more crystalline polymers in the active layer and enhanced hole conductivities. Nonlimiting examples of additives include 1,8-octanedithiol, ortho-dichlorobenzene, 1,8-diiodooctane (DIO), and nitrobenzene.

As used herein, "spraying" means forming a jet of vapor or finely divided liquid. Nonlimiting examples of means to spray include hydraulic spray techniques, atomizing spray techniques, electrospray techniques, and thermal spray techniques.

As used herein, "sol-gel" refers to a nanoparticle polymer composition formed during a step where at least one of the precursors is an aqueous or organic dispersion, sol, or solution. Suitable sol-gel base materials are those materials that are compatible with zinc oxide, and include, but are not limited to, xerogels that are based on TMOS (teframethoxysilane, $Si(OMe)$)) or TMOS co-doped with one or more of the following additives: poly(N-vinylimidazole) (PNV, cationic), poly(ethyleneimine) (PE, cationic), poly(ethyleneoxide) (PEO, neutral), triethoxysilane (TREOS, $HSi(OEt)_3$), diethoxydimethylsilane (DEDMS, $SiMe_2(OEt)_2$), diethoxymethylsilane (DEMS, $HSiMe(OEt)_2$), aminopropyltriethoxysilane (APTES, $H_2N—(CH_2)_3Si(OMe)_3$), or carboxypropyltriethoxysilane (CPTES, $HOOC—(CH_2)_3Si(OMe)_3$), xerogels based on tefraethylorthosilane (TEOS) or TEOS co-doped with one or more of the above additives, hybrid n-propyl-trimethoxysilane (pro-TriMOS)/teframethylorthosilane (TMOS) xerogels, bis[3-(frimethoxysilyl)propyl]ethylenediamin (enTMOS)/TEOS xerogels, hybrid TEOS/aminopropyl-triethoxysilane (APTES) xerogels, hybrid TMOS/pro-triMOS/enTMOS xerogels, and hybrid TMOS/n-octyl-triethoxysilane xerogels.

The present invention includes a novel method to fabricate organic solar arrays with transparent contacts using a layer-by-layer spray technique. This provides for a balance between conductivity and transparency for the spray-on contacts. Further, solar illumination has been demonstrated to improve solar array efficiency up to 250%, though this performance enhancement under illumination only happens with sprayed devices, not devices made by spin coating. This means that solar cells made with the spray-on technique performs better under sunlight, which is beneficial for solar energy application All masks described herein for spray were custom made by Towne Technologies, Inc.

EXAMPLE 1

Corning® low alkaline earth boro-aluminosilicate glass substrate (Delta Technology, Inc.) having a nominal sheet resistance of 4-10 Ω/square was pre-cut 4"×4" was prepared. Indium tin oxide (ITO) was patterned on the glass substrates using photolithography. For example, Shipley 1813 was spin coated at 4500 rpm onto the substrate and soft baked on a hotplate for 3 minutes at 90° C. The substrate was then exposed to a UV-lamp for 1.4 seconds in a constant intensity mode set to 25 watts. The structure was developed for about 2.5 minutes using Shipley MF319 and rinsed with water. The substrate was then hard-baked, at 145° C. for 4 minutes and any excess photoresist cleaned off with acetone and cotton. After cleaning, the substrate was etched from about 5-11 minutes with a solution of 20% HCl/7% $HNO_3$ on a hotplate at 90° C. to 130° C., such as 100° C. Alternatively, spray lithography is used. The substrate is placed onto a flat magnet and a magnetic shadow mask is aligned over the substrate. The shadow mask may be provided in any desired shape. Next, photoresist is applied to the substrate using an airbrush. An airbrush with a fine tip and a pressure setting between 10 to 40 psi is preferred. Etching is performed in an aqua regia solution, such as a solution of 20 HCL/7% $HNO_3$ at 90° C. to 130° C. The substrate is then cleaned, and placed in a glove box and annealed at 145° C. for 4 minutes and any excess photoresist cleaned off with acetone and cotton.

The patterned substrates were rinsed with acetone and isopropanol before being subject to UV-Ozone treatment for at least fifteen minutes. The ITO layer thickness was 125 nm (25 nm) as observed in Dektak D150 profilometry measurements.

A ZnO layer was formed onto the patterned ITO layer. A ZnO sol-gel precursor solution was formed by dissolving 0.668 g of zinc acetate (anhydrous) in a mixture of 4.775 mL of 2-methoxyethanol and 0.225 mL of ethanolamine. Alternatively, methoxyethoxyacetic acid may be used (See Mathilde, et al., The effect of post-processing treatments on inflection points in current-voltage curves of roll-to-roll processed polymer photovoltaics, Solar Energy Materials & Solar Cells. December 2010; 94 (12):2018-2031). The resulting solution was stirred and heated at 60° C. for 1 hour.

Prior to ZnO deposition, the edges of the substrate were covered with 0.75 in. wide Invisible Tape (3M Company, Maplewood, Minn.). The ZnO solution was spray-coated onto the ITO-on-glass substrate using an iwata HP-SB Plus handheld airbrush (Iwata-Medea, Inc., Portland Oreg.) from a height ranging from 8 cm to 14 cm using a carrier gas pressure of 20 psi. The volumetric flow rate of the solution was between 0.05 mL/min and 0.2 mL/min. The dynamics of the airbrush were controlled in such a manner as to leave a continuous, yet very thin wet film. In particular, one full coat was applied by a serpentine patterned handheld motion where the width of each pass was wider than the area left exposed by the tape and where between 10 and 15 passes offset by the appropriate vertical distance (0.4 cm to 0.6 cm) were used to realize one coat. After the deposition, the tape was removed from the edges of the substrate and the sample was then baked on a hotplate at 275° C. for 6 min Afterwards, the sample was allowed 30 min to cool before being rinsed with DI $H_2O$, and blown dry with $N_2$. The sample was then rinsed with acetone and dried with $N_2$ as before, followed by rinsing with isopropanol and blown dry with $N_2$. The resulting ZnO layer had a thickness of 20 nm to 150 nm.

Poly(3-hexylthiophene) (P3HT) was dissolved in dichlorobenzene (DCB) at a concentration of 20 mg/mL. Phenyl-C60-Butyric acid-Methyl ester (PCBM) was dissolved in DCB at a concentration of 20 mg/mL. These two solutions were stirred overnight on a hot plate at 60° C. The two were then mixed together at a 1:1 volume ratio (P3HT:PCBM solution). The resulting blend solution was stirred at least 1 hour before deposition.

The substrate was placed on top of a magnet on a hot plate set to 90° C. The "50 cell active" shadow mask was placed on top in such a manner that the right edge of the 9 left most openings in the mask were aligned with the left edge of the neighboring ITO electrodes. Before deposition of the P3HT: PCBM blend, the device was allowed 15 min on the hotplate to warm up. The P3HT:PCBM blend solution was then sprayed on top of the shadow mask using an iwata HP-SB Plus handheld airbrush from a height of 8 cm to 14 cm above the sample at a volumetric flow rate of 0.4 mL/min to 0.9 mL/min using a carrier gas pressure of 20 psi. Several coats were sequentially applied in the form of a serpentine patterned handheld motion where the width of each pass was wider than the total area exposed through the shadow mask and where between 5 and 10 passes offset by the appropriate vertical distance (1.2 cm to 0.6 cm) were used to realize one coat, until an amount of 0.3 mL of solution was deposited, forming an active layer with a thickness of 150 nm to 500 nm After deposition, the shadow mask was removed.

Poly(3,4-ethylenedioxythiophene) poly(styrenesulfonate) (PEDOT:PSS) PH750 was passed through a 0.45 micrometer filter. An amount of dimethylsulfoxide (DMSO) was added such that the resulting composition was 5% DMSO, 95% PEDOT:PSS PH750. The solution was sonicated for 1 hour before deposition. The "PEDOT" shadow mask was placed on top of the sample in such a manner ('shifted') that the right edge of the 45 left-most openings in the mask were aligned with the left edge of the neighboring cell active layer films, i.e. the 9 columns of 5 rows on the left. It is noted that the pattern is open to the right side, thus requiring the tape to limit the width of the PEDOT based parallel connections.

The left edge and right edges of the substrate were covered with Invisible Tape. For the left edge, the tape was made sure to cover from the left edge of the substrate to the left edge of the PEDOT mask, and from top of the substrate to the bottom. For the right edge, the tape covered from the right edge of the substrate up to a few centimeters to the right of the edge of the PEDOT shadow mask, and from the top of the substrate to the bottom.

A kovar shadow mask was aligned into position and magnetized to the substrate. Additionally, the mask was taped to the substrate, at the very least on the left side, mainly to prevent stray PEDOT from accumulating outside of the area covered by the mask. However, it is noted that the tape also secured the mask. The modified PEDOT solution was then sprayed on top of the shadow mask using an iwata HP-SB Plus handheld airbrush from a height of 3 cm to 7 cm above the sample at volumetric flow rate of 0.05 mL/min to 0.1 mL/min using a carrier gas pressure of 20 psi. Several coats were sequentially applied in the form of a serpentine patterned handheld motion where the width of each pass was wider than the total area exposed through the shadow mask and where between 15 and 20 passes offset by the appropriate vertical distance (0.4 cm to 0.3 cm) were used to realize one coat, until an amount of 1.5 mL of solution was deposited, which formed a PEDOT layer thickness of 500 nm to 1500 nm. After deposition, the shadow mask was removed.

The finished array was transferred briefly into a glovebox and moved into the entry ante-chamber and into an Angstrom-thermal vapor deposition (TVD) chamber, which was evacuated to $10^{-6}$ Torr; the array was held there for 1 hour. After removal of the array from the TVD chamber, it was heated to a temperature of 150° C. and held there for 8 min. The array was then allowed to cool to room temperature. Finally, silver paint was applied to facilitate contact between the testing electrodes and the left ITO electrode, as well as the right modified PEDOT electrode.

EXAMPLE 2

Figure 2:
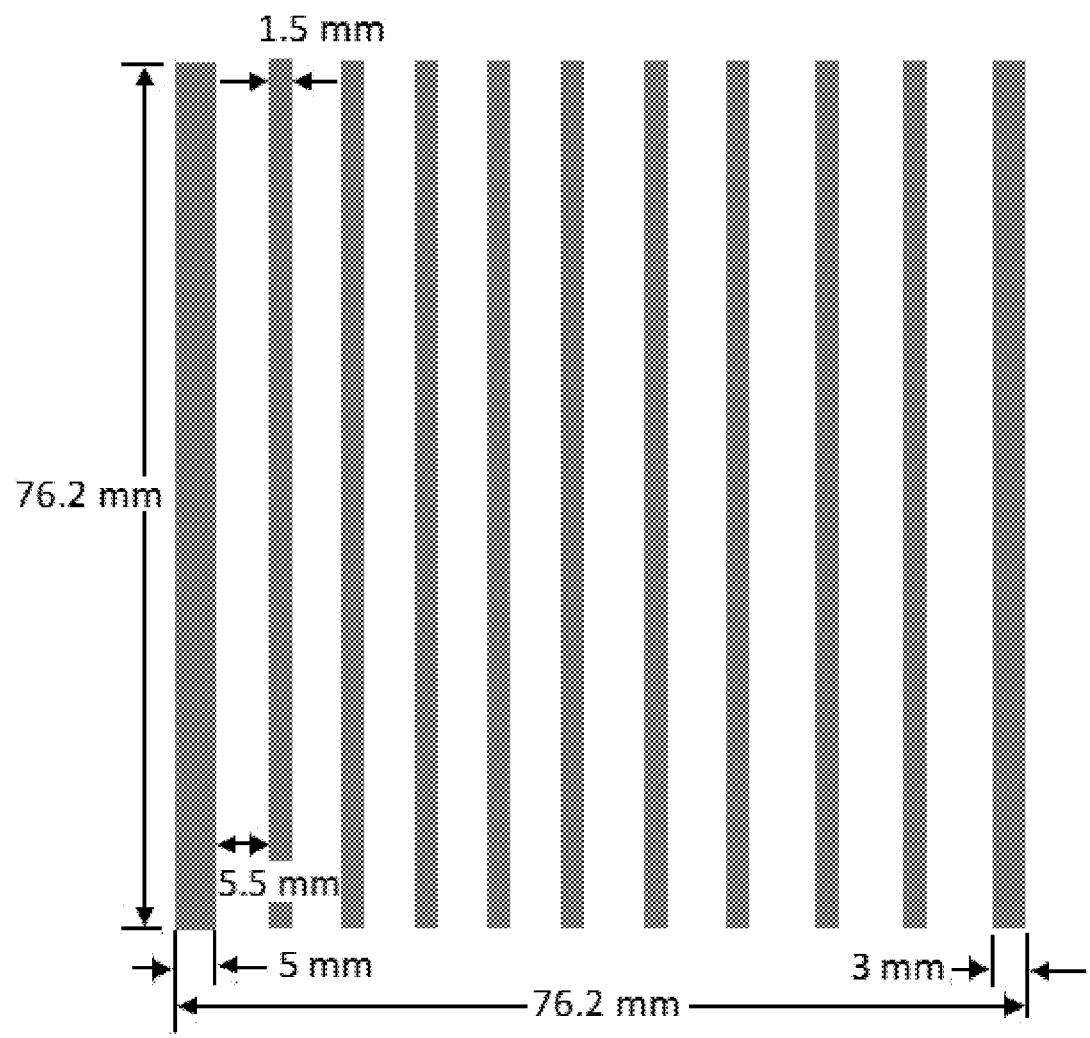
FIG. 2 is a top-down illustration of the device architecture of an inverted array showing the active layer pattern using a mask.
Figure 3:
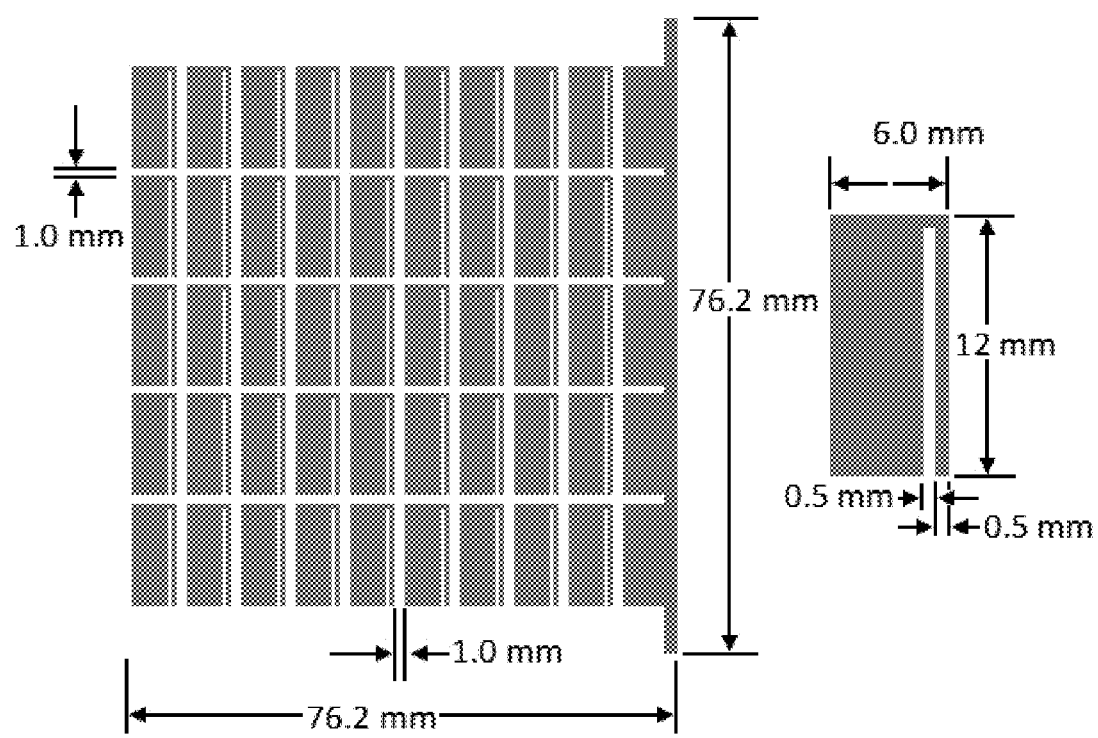
FIG. 3 is a top-down illustration of the device architecture of an inverted array showing the PEDOT layer applied using a mask. The right illustration shows an enlarged array element.
Figure 4:
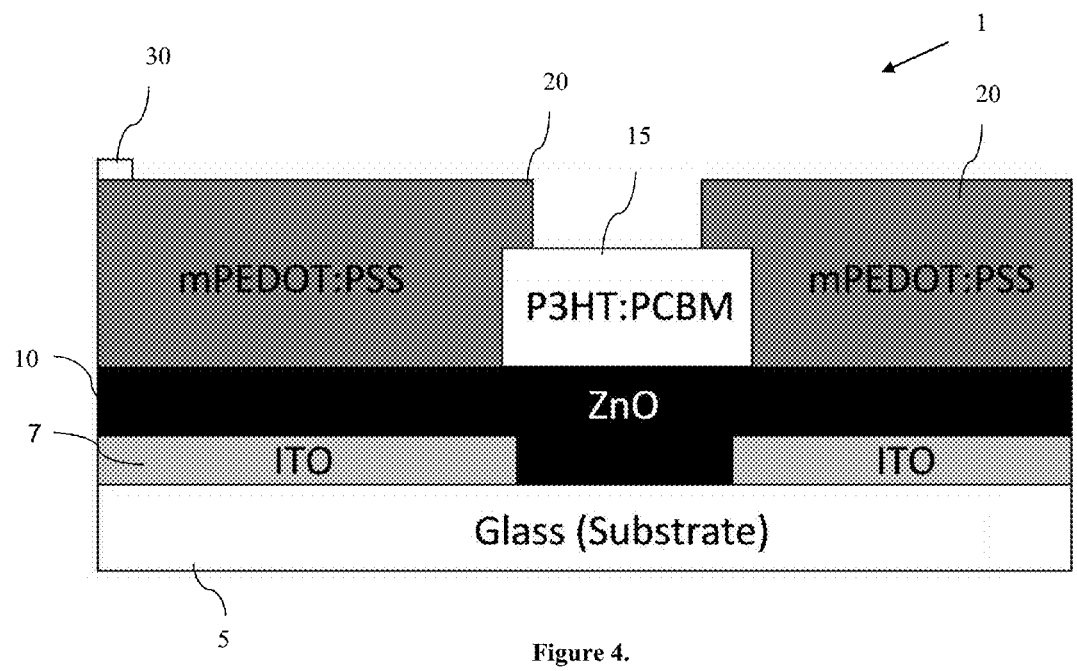
FIG. 4 is a cross-section illustration of the organic photovoltaic layers.

Inverted organic photovoltaic cell 1, seen in cross-section in FIG. 4, was created using the method described above. Inverted photovoltaic cell 1 was composed of different layers of active materials and terminals (anode and cathode) built onto substrate 5. Cathode 7, comprised of ITO in the present example, was sprayed onto substrate 5 forming a 'box-like' pattern, shown in FIG. 1, and having a contact that extended from a first edge of substrate 5 to a second edge of the substrate. In the present example, the contact is shown on the left side of the pattern, though the contact may be adjusted as would be obvious to one of skill in the art. Electron transport layer (ETL) 10 covers cathode 7, except for the outermost edges. The components of the ETL were chosen to provide a gradient for charges crossing the interface, approximating a conventional p-n junction with organic semiconductors, thereby providing an increased efficiency of heterojunctions. An exemplary interfacial layer is composed sol-gel zinc oxide. Active layer 15 was disposed as lines that extend from the first edge of substrate 5 to the second edge of the substrate, as seen in FIG. 2. Active layer 15 was provided directly on top of electron transport layer 10, and was prepared using poly(3-hexylthiophene) and 6,6-phenyl C61 butyric acid methyl ester. Anode 20 was disposed overlying the active layer in a modified 'box-like' pattern, seen in FIG. 3. Anode 20 includes a contact that extended from a first edge of substrate 5 to a second edge of the substrate, opposite the cathode contact. In the present example, the contact is shown on the right side of the pattern, but may be altered as would be apparent to one of skill in the art. Exemplary anode materials include PEDOT:PSS doped with dimethylsulfoxide. Connector 30 provides a closed circuit between the cathode contact and the anode contact. Connector 30 is an electroconductive material, such as silver, tin alloys such as $SnO_2$/Sb, aluminum, conductive PEDOT:PSS, and antimony-doped tin oxide. The fully encapsulated array was found to possess over significantly enhanced transparency compared to other OPVs, such as between 20% and 40% enhanced transparency depending on final thickness of the array.

EXAMPLE 3

A Corning® low alkaline earth boro-aluminosilicate glass substrate coated in indium tin oxide (ITO) and having a nominal sheet resistance of 4-10 Ω/square (Delta Technology, Inc. Phoenix, Ariz.) was pre-cut 4"×4", and patterned using a positive photo resist, Shipley 1813. A magnetic shadow mask was magnetized to cover the substrate and Shipley 1813 was spray coated using nitrogen ($N_2$) as the carrier gas, set to <10 psi, with the airbrush positioned about 7-10 cm from the substrate. The substrate was then soft baked on a hotplate for 3 minutes at 90° C. and exposed to a UV lamp for 1.4 seconds using a constant intensity mode set to 25 watts. The structure was developed for about 2.5 minutes using Shipley MF319, rinsed with water, and hard-baked at 145° C. for 4 minutes. Any excess photoresist was cleaned off with acetone and cotton. The substrate was etched 5-11 minutes with a solution of 20% HCl and 7% $HNO_3$ on a hotplate set to 130° C., and the structure cleaned using sonication in trichloroethylene (TCE), followed by a sonication cleaning in acetone followed by isopropanol at 50° C. for 20 minutes for each cleaning. The structure was further cleaned using UV-ozone for thirty minutes. The patterned substrate was then placed in a glove box.

An interstitial layer was prepared of $Cs_2CO_3$. 0.2% wt. $Cs_2CO_3$ (2 mg/mL; Sigma-Aldrich Co. LLC, St. Louis, Mo.) was stirred in 2-ethoxyethanol for one hour at room temperature, and sprayed onto the clean ITO substrate through a custom made shadow mask with an airbrush using $N_2$ set to 20 psi from a distance of about 7-10 centimeters. The product was then annealed for 10 minutes at 150° C. in an $N_2$ glovebox (MOD-01; M. Braun Inertgas-Systeme GmbH, Garching German).

The active layer solution was prepared by mixing separate solutions of a high molecular weight poly(3-hexylthiophene) (P3HT with regioregularity over 99% and average molecular weight of 42K; Rieke Metals, Inc., Lincoln, Nebr.) and 6,6-phenyl C61 butyric acid methyl ester (PCBM, $C_{60}$ with 99.5% purity; Nano-C, Inc., Westwood, Mass.) at a weight ratio of 1:1 in dichlorobenzene at 17 mg/mL and stirring each on a hotplate for 27 hours at 50° C. The active coating was then spray coated onto the $Cs_2CO_3$ coated substrate using an airbrush with $N_2$ set to 30 psi, set at about 7-10 cm away from the substrate using multiple light layers, resulting in a layer thickness of about 200 to about 300 nm. The device is then left to dry under a petri dish for 30 minutes for at least 12 hours. After drying, the device was thermally annealed on a hotplate at 110° C. for 10 minutes.

Aqueous poly (3,4) ethylenedioxythiophene:poly-styrenesulfonate (PEDOT:PSS, Baytron 500 and 750; H. C. Starck GmbH, Goslar Germany) was diluted and filtered through a 0.45 μm filter. This filtered solution of PEDOT:PSS was mixed with 5 vol. % of dimethylsulfoxide (Lim, et al., Spray-deposited poly(3,4-ethylenedioxythiophene):poly(styrenesulfonate) top electrode for organic solar cells. *Appl. Phys. Lett.* 2008, 93, 193301) and stirred at room temperature followed by 10 minute sonification at 50° C. The anode was applied by spraying an m-PED coating through a magnetized substrate/mask on a hotplate (95° C.) using $N_2$), set to 20 psi, with the airbrush positioned about 3-7 cm from the substrate. The series connection locations were wiped using a wooden dowel to expose the anode for later electrical connection. Multiple light layers were applied, allowing each layer to dry before the next layer was applied, until the final thickness of about 500 nm was reached. The modified PEDOT should be applied as very light discontinuous coats until the anode layer coating reaches the desired thickness. Each layer was allowed to dry before the next layer is applied. Care was taken to avoid removing the mPED with the mask. The substrate was placed into high vacuum treatment ($10^{-6}$ Torr) for 1 h, followed by a substrate annealing at 120-160° C. for 10 min.

The finished device was placed into high vacuum ($10^{-6}$ Torr) for 1 h. This step was shown to improve the device performance with sprayed active layer (Lim, et al., Spray-deposited poly(3,4-ethylenedioxythiophene): poly(styrenesulfonate) top electrode for organic solar cells. *Appl. Phys. Lett.* 2008, 93, 193301). The final device was annealed at various conditions, including 120° C., 160° C., and step annealed comprising 120° C. for 10 minutes followed by high vacuum for 1 hour and annealing at 160° C. for 10 minutes. The annealed device was encapsulated using a UV-cured encapsulant (EPO-TEK OG142-12; Epoxy Technology, Inc., Billerica, Mass.) was applied to the edge of the encapsulation glass, and the glass is placed into the glovebox for at least 15 min, with UV exposure. The device was then flipped upside down, and the epoxy applied on top of the encapsulation glass. The device was finally exposed to 15 min of UV to cure the encapsulant epoxy.

EXAMPLE 4

A Corning® low alkaline earth boro-aluminosilicate glass substrate with indium tin oxide (ITO, Delta Technology, Inc.) having a nominal sheet resistance of 4-10 Ω/square was pre-cut 4"×4", and patterned using a positive photo resist, Shipley 1813, spin coated at 4500 rpm and soft baked on a hotplate for 3 minutes at 90° C. The structure was exposed to a UV lamp for 1.4 seconds using a constant intensity mode set to 25 watts. The structure was developed for about 2.5 minutes using Shipley MF319, rinsed with water, and hard-baked at 145° C. for 4 minutes and excess photoresist cleaned off with acetone and cotton. The substrate was etched 5-11 minutes with a solution of 20% HCl and 7% $HNO_3$ at 100° C., and cleaned by hand using acetone followed by isopropanol, and UV-ozone treatment for at least fifteen minutes.

A $Cs_2CO_3$ interfacial buffer layer was prepared (0.2% wt. (2 mg/mL) $Cs_2CO_3$ (Aldrich) in 2-ethoxyethanol) and stirred for one hour. The layer was applied to the substrate by spray coat using $N_2$ set to 20 psi from a distance of about 7-10 centimeters and annealed for 10 minutes at 150° C. in an $N_2$ glovebox (MBraun MOD-01). The active layer solution was prepared by mixing separate solutions of poly(3-hexylthiophene) (P3HT; Riekie Metals, Inc., Lincoln, Nebr.; average molecular weight of 42 K and regioregularity over 99%) and 6,6-phenyl C61 butyric acid methyl ester (PCBM; $C_{60}$, Nano-C, Inc., Westwood, Mass.; 99.5% purity) in dichlorobenzene at 20 mg/mL and stirring separately on a hotplate for 24 hours at 60° C. The solutions were mixed together at a 1:1 ratio and mixed for an additional 24 hours at 60° C., producing a final solution of 10 mg/mL. The active coating was spray coated using $N_2$ set to thirty 30 psi from a distance of about 7-10 centimeters. Multiple light layers were sprayed onto the structure first, at about 600-900 μm per spray. A final thick continuous coat was then applied to complete the active layer coating having a final layer thickness of about 200-300 nm. A cotton cloth with DCB was used to wipe excess from the substrate. The structure was then wiped with a cotton cloth in isopropanol. The substrate was then dried in an antechamber under vacuum for at least twelve 12 hours. A kovar shadow mask was aligned into position and taped onto the substrate. The series connection locations were then wiped using a wooden dowel.

The anodic buffer layer was prepared using a modified poly (3,4) ethylenedioxythiophene (PEDOT) and poly(styrenesulfonate) (PSS) solution (PEDOT:PSS; Baytron 500 and 750; H. C. Starck GmbH., Munich, Germany), filtered using a 0.45 μm filter. The filtered PEDOT:PSS was mixed with 5 vol % of dimethylsulfoxide and was stirred at room temperature followed by one 1 hour of sonification to form a modified PEDOT:PSS (mPED). A mask was placed onto the cell containing the applied layers and the device placed on a hotplate at 90° C. the mPED coating was spray coated using nitrogen ($N_2$) as the carrier gas, set to 30 psi from a distance of about seven to ten centimeters 7-10 cm. Multiple light layers of spray were applied until the final thickness is reached. The substrate was then removed from the hotplate and the mask is removed. Care was taken to avoid removing the mPED with the mask.

The substrate was then subjected to a high vacuum ($10^{-6}$ Torr) for 1 hour, which improved the device performance with the sprayed active layer (Lim, et al., Spray-deposited poly(3,4-ethylenedioxythiophene):poly(styrenesulfonate) top electrode for organic solar cells, Appl. Phys. Lett. 93 (2008) 193301-193304). After the vacuum, the device was annealed for 10 minutes at 120° C. The vacuuming and annealing steps were then repeated a second time, at the same conditions. The substrate was finally encapsulated by applying silver paint to the device contacts or a UV-cured encapsulant (EPO-TEK OG142-12; Epoxy Technology, Inc., Billerica, Mass.) and allowing the paint to dry. The encapsulated glass was then notched and cleaned by hand using acetone and isopropanol, followed by at least 15 minutes of UV-ozone cleaning. The device is then exposed to UV-ozone for 15 minutes to cure the encapsulate epoxy.

EXAMPLE 5

The current-voltage (I-V) characterization of the solar array was performed using a Newport 1.6 KW solar simulator under AM1.5 irradiance of 100 mW/cm². Previous testing of the interstitial $Cs_2CO_3$ layer effect on the performance of the inverted cell showed organic photovoltaic cells without $Cs_2CO_3$, i.e. having an ITO layer with active layer on top of the ITO layer, performed almost like a resistor and had negligible $V_{oc}$ (0.03 V). The lower performance was due to non-ohmic contact with the cathode, with reduced built-in electric field across the active layer. ITO normally has a work function of ~4.9 eV, and is traditionally used as an anode in typical OPV devices. There have been previous reports on tuning the work function of ITO by adding an electron transport layer such as ZnO (Zou, et al., Metal grid/conducting polymer hybrid transparent electrode for inverted polymer solar cells, Appl. Phys. Lett. 96 (2010) 203301-203304), $TiO_2$ (Huang, et al., A Semi-transparent plastic solar cell fabricated by a lamination process, Adv. Mater. 20 (2008) 415-419; Yu, et al., Efficient inverted solar cells using $TiO_2$ nanotube arrays, Nanotechnology 19 (2008) 255202-255207; Li, et al., Efficient inverted polymer solar cells, Appl. Phys. Lett. 88 (2006) 253503-253506), PEO (Zhou, et al., Inverted and transparent polymer solar cells prepared with vacuum-free processing, Sol. Eng. Sol. Cells 93 (2009) 497-500) and $Cs_2CO_3$ (Huang, et al., A Semi-transparent plastic solar cell fabricated by a lamination process, Adv. Mater. 20 (2008) 415-419; Yu, et al., Efficient inverted solar cells using $TiO_2$ nanotube arrays, Nanotechnology 19 (2008) 255202-255207; Li, et al., Efficient inverted polymer solar cells, Appl. Phys. Lett. 88 (2006) 253503-253506) in inverted OPV single cells. Previous report showed $Cs_2CO_3$ can lower the ITO work function to as low as 3.3 eV.

In Examples 1 and 2, a ZnO sol-gel precursor solution was spray coated onto the ITO, forming a ZnO layer with a thickness of 20 nm to 150 nm. In Examples 3 and 4, a spray coating a solution of 2-ethoxyethanol with 0.2% $Cs_2CO_3$ resulted in a very thin layer (~10 Å) of $Cs_2CO_3$ on the ITO, allowing ITO to serve as the cathode. The effective work function of a control ITO/$Cs_2CO_3$ was found to be close to 4.1 eV.

EXAMPLE 6

Figure 5:
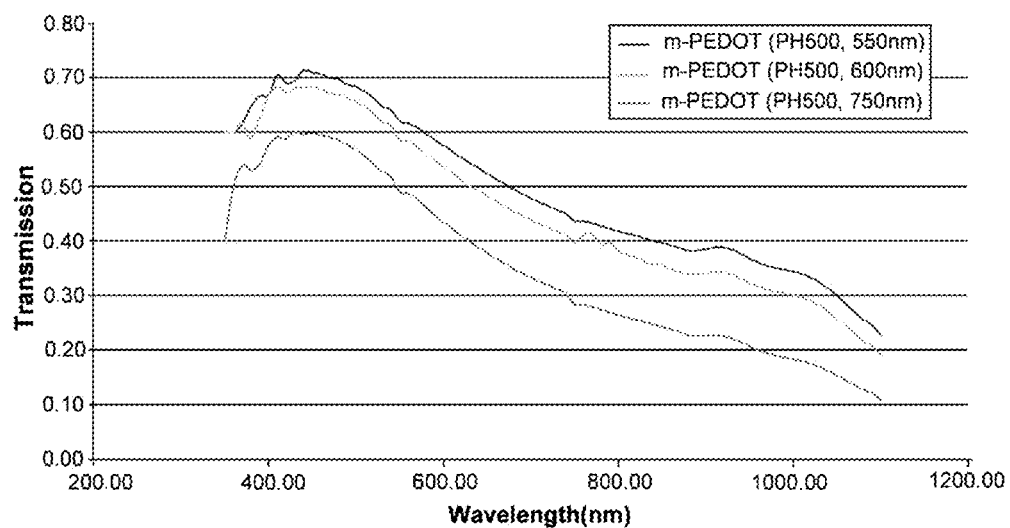
FIG. 5 is a graph showing the transmission spectra of PEDOT:PSS with 5% DMSO at different spray thickness indicated, the range of thickness from 500 nm to 1 μm, and transmittance at 550 nm 60-60%.
Figure 6:
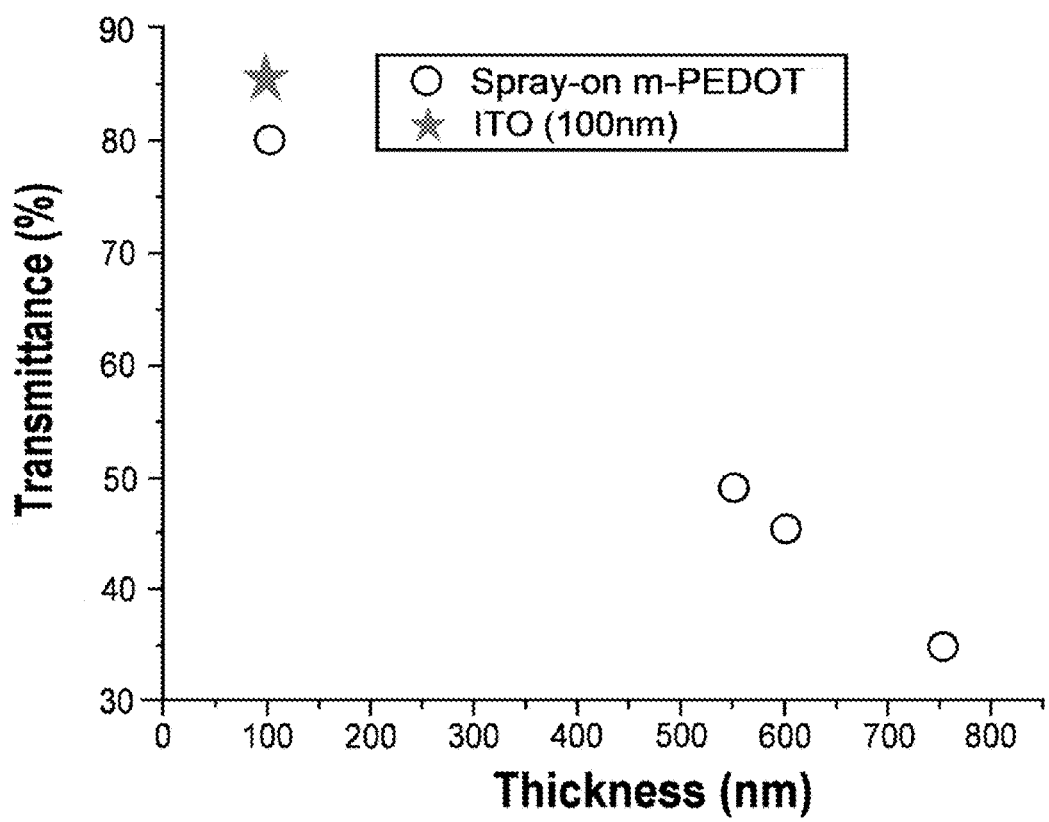
FIG. 6 is a graph showing a comparison of the transmittance between ITO and the spray-on anode of m-PEDOT (modified PEDOT:PSS) with different thicknesses.
Figure 7:
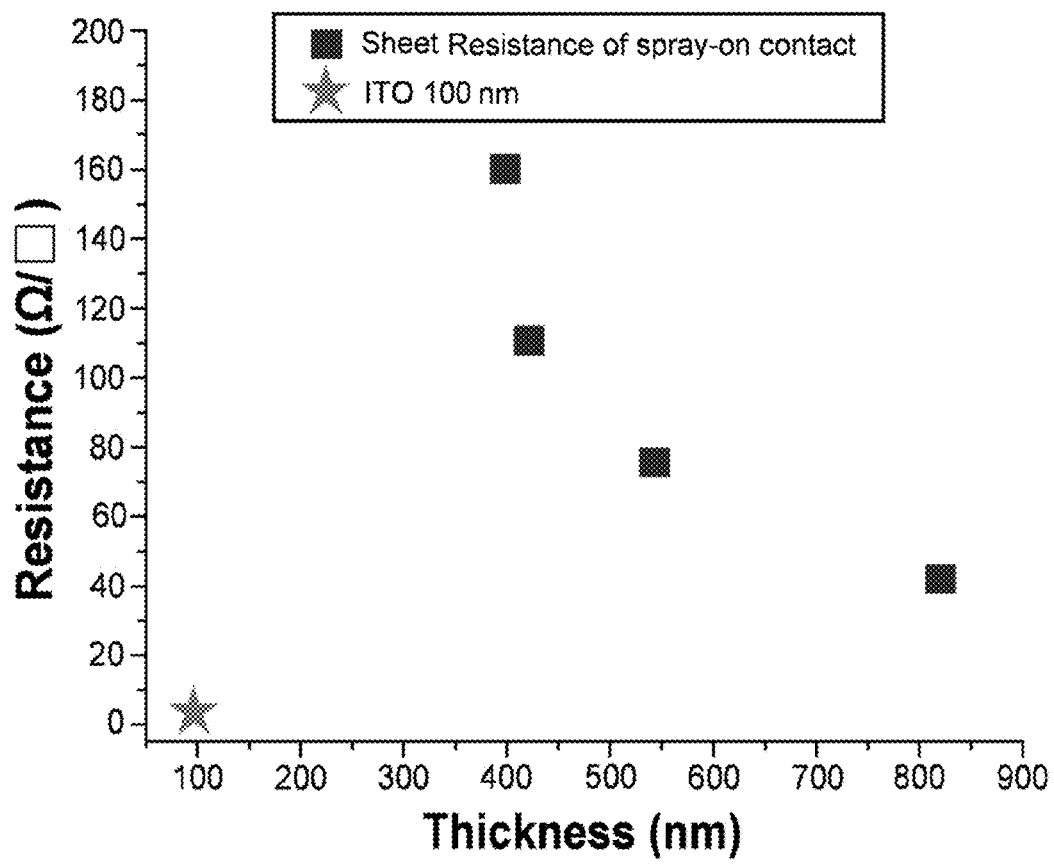
FIG. 7 is a graph showing a comparison of the sheet resistance between ITO and the spray-on anode of m-PEDOT (modified PEDOT:PSS) with different thicknesses.

Photovoltaic cells were prepared using the methods described in Examples 3 and 4, with PH-500 modified 5% DMSO. The transmission spectra of the sprayed-on mPEDOT was measured for different wavelengths, using different thicknesses of active layer, as seen in FIG. 5. Transmittance was measured using a 250 W tungsten halogen lamp coupled with a monochromator (Newport Oriel Cornerstone ¼ m), using ITO as a reference for comparison. At a thickness of about 100 nm, the transmittance of m-PEDOT is about 80%, comparable with ITO, as seen in FIG. 6. The sheet resistance of m-PEDOT was measured using a standard four-point probe measurement (Van Zant, Microchip Fabrication, McGraw-Hill, New York, ISBN 0-07-135636-3, 2000, pp. 431-2; van der Pauw, A method of measuring the resistivity and Hall coefficient on lamellae of arbitrary shape, Philips Tech. Rev. 20 (1958) 220-224). As expected, the resistance decreases as thickness increases, which is consistent with the bulk model, as seen in FIG. 7.

Figure 8:
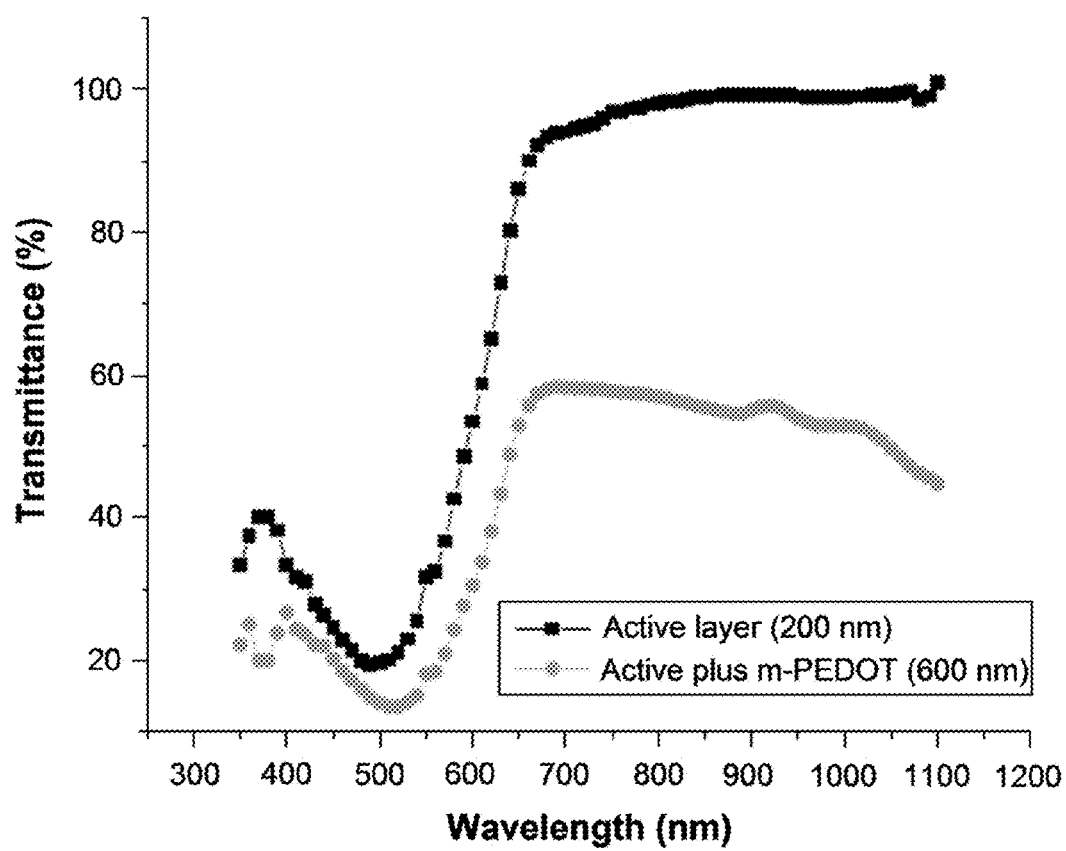
FIG. 8 is a graph showing the transmission spectra of an active layer (P3HT:PCBM) of 200 nm (black line with filled square), and with a m-PEDOT:PSS layer of 600 nm (grey line with filled circle).

These transmittance and sheet resistance parameters indicate the feasibility of replacing metal contacts with m-PEDOT. The trade-off between transparency and resistance is another important fabrication parameter. Arrays fabricated with a thickness of about 600 nm showed moderate resistance of 70 Ω/square and transmittance of about 50%. However, for a 200 nm thick active layer (P3HT:PCBM), application of a 600 nm thick m-PEDOT anode decreased total transmittance over the spectra range from 73% to 31%, as seen in FIG. 8.

Figure 9:
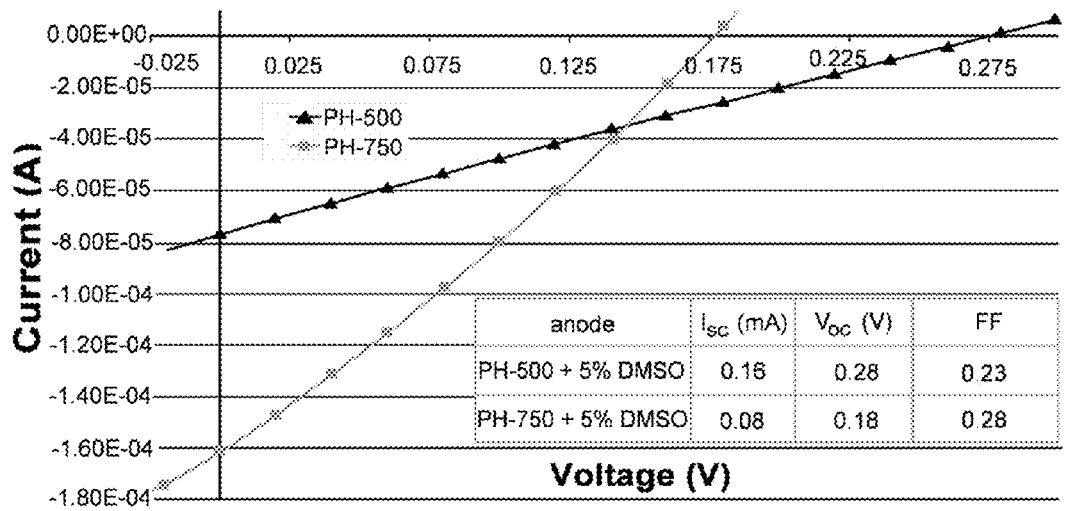
FIG. 9 is a graph showing the voltage versus current, indicating how different m-PEDOT layer compositions affect the performance of the inverted photovoltaic cell.

Photovoltaic cells were manufactured using different modified PEDOT compositions (using 5% DMSO to modify the PEDOT). PH-750 showed a strong initial current, which decreased with increasing voltage. Conversely, PH-500 performed poorly at lower voltages, but better than PH-750 at higher voltage, as seen in FIG. 9.

Figure 10:
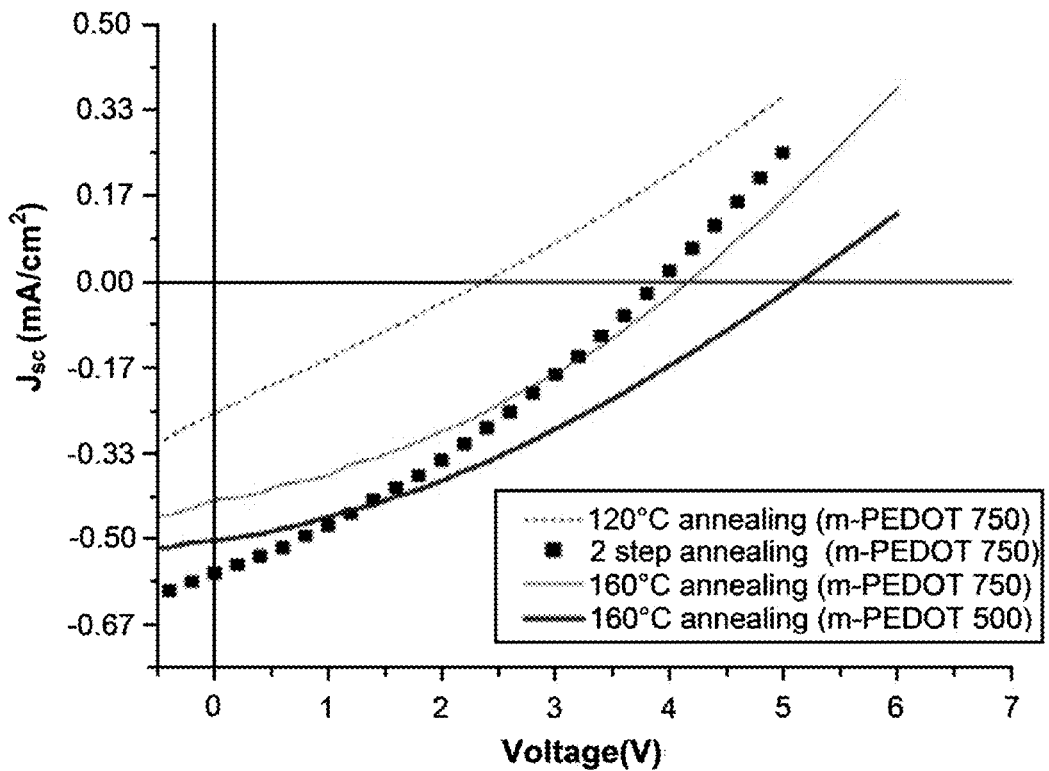
FIG. 10 is a graph showing the I-V characteristics of 4 inverted spray-on solar arrays measured with AM1.5 solar illumination under various annealing conditions: 1-step annealing at 120° C. (dashed line), or 160° C. (thin grey line), and 2-step annealing (black filled square). These 3 arrays use m-PEDOT 750 as the anode. The 4th array (thick black line) used m-PEDOT 500 as the anode and was annealed at 160° C.

Annealing has shown to be the most important factor to improve organic solar cell performance. Previous testing shows that a single-step annealing at 120° C. gives the best result in test cell, with $V_{oc}$=0.48 V, $I_{sc}$=0.23 mA, FF=0.44, and a power conversion efficiency (PCE) of 1.2% under AM1.5 solar illumination with intensity 100 mW/cm². A two-step annealing, first at 120° C. followed by 160° C. worsened device performance, mainly due to unfavorable change of film morphology. Results of a single-step annealing at 160° C. was between 120° C. annealing and the two-step annealing, yet the device has the worst FF, seen in FIG. 10. Table 2 listed the details of the I-V characteristics of these three test cells.

TABLE 2

Test cell I-V characteristics comparison at various annealing conditions.

| Test cell number | $I_{sc}$ (mA) | $V_{oc}$ (V) | FF | η (%) | Annealing condition |
|---|---|---|---|---|---|
| 1 | 0.28 | 0.48 | 0.26 | 0.86 | 160° C., 10 min |
| 2 | 0.23 | 0.48 | 0.44 | 1.2 | 120° C., 10 min |
| 3 | 0.16 | 0.30 | 0.35 | 0.43 | 2-step |

Testing showed some inconsistency between PCE and IPCE for the cells annealed at 160 and 120° C., as the cells annealed at 160° C. have higher IPCE yet lower PCE than that at 120° C. IPCE measurement was done under illumination from the Tungsten lamp, whereas I-V was done under solar simulator, which has a different spectrum than that of the tungsten lamp. Nevertheless, the integration of IPCE should be proportional to $I_{sc}$. The ratio between integral of IPCE at 160° C. vs. 120° C. is about 1.3, and the ratio of $I_{sc}$ of the same devices was 1.2. The discrepancy may be due to bi-molecular (BM) recombination, which sets in under high light intensity (solar simulator) (Shaheen, et al., 2.5% efficient organic plastic solar cells, Appl. Phys. Lett. 78 (2001) 841-843), meaning the cell, which has more prominent BM recombination, will perform poorer with high intensity illumination such as that from the solar simulator.

Figure 11:
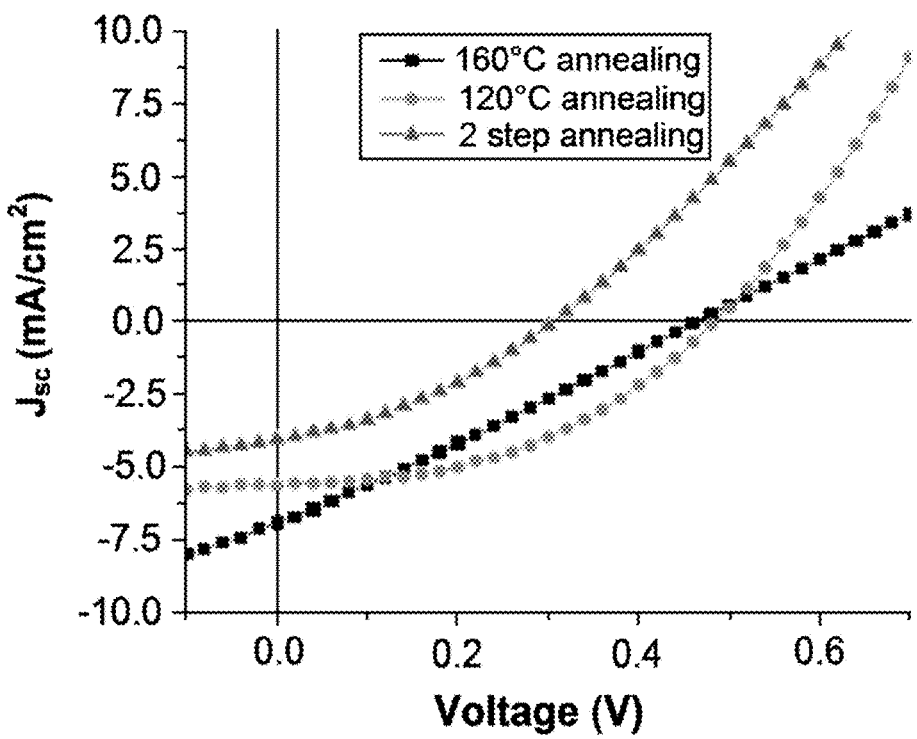
FIG. 11 is a graph showing the I-V characteristics of three test cells measured with AM1.5 solar illumination under different annealing conditions; 1-step annealing at either 120° C. (light grey circle), or 160° C. (black filled square) for 10 min; 2-step annealing at 120° C. for 10 min, followed by high vacuum for 1 h and annealing at 160° C. for 10 min (medium grey triangle).
Figure 12:
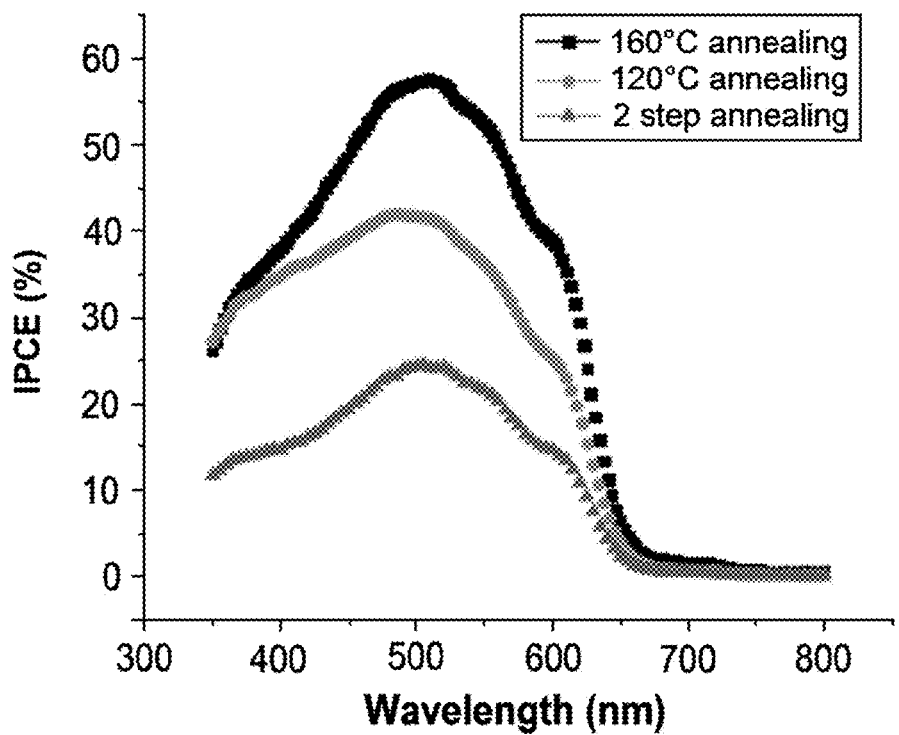
FIG. 12 is a graph showing the IPCE of three test cells under tungsten lamp illumination. Different annealing conditions were 1-step annealing at either 120° C. (light grey circle), or 160° C. (black filled square) for 10 min; 2-step annealing at 120° C. for 10 min, followed by high vacuum for 1 h and annealing at 160° C. for 10 min (medium grey triangle).

Single-step annealing at 120° C. (b) showed the best film roughness and phase segregation of P3HT and PCBM, which explains the high device performance using this annealing profile, as seen in FIGS. 11 and 12. Two-step annealing exhibited the smoothest film, but also resulted in less distinct phase segregation indicating that P3HT chains and PCBM molecules are penetrating through each other at 160° C., and form much smaller nano-domains, which are favorable for charge transport between the domains (Kline and McGehee, Morphology and charge transport in conjugated polymers, J Macromol. Sci. C: Polym. Rev. 46 (2006) 27-45). However, recombination of photogenerated carriers might be enhanced due to the lack of separate pathways for electrons and holes. Testing of the effects of annealing on two anode compositions—m-PEDOT 500 and m-PEDOT 750, using an array of 50 inverted cells. Single-step annealing at low temperature (120° C.) gave the worst result, and single-step annealing at high temperature (160° C.) the best $V_{oc}$, while the two-step annealing yields the highest $J_{sc}$. In terms of anode, m-PEDOT 500 exhibited higher $V_{oc}$ than PEDOT 750, as seen in Table 3. However, there is not much difference of PCE between 2-step annealing and 1-step annealing at 160° C., which is in contrast with the result of the test device, seen in FIGS. 11 and 12. It is possible the array required a longer anneal, due to its larger area and amounts of material used in the array versus test device.

TABLE 3

Array I-V characteristics comparison at various annealing conditions.

| Array number | $I_{sc}$ (mA) | $V_{oc}$ (V) | FF | η (%) | Annealing condition | m-PEDOT |
|---|---|---|---|---|---|---|
| 1 | 17.0 | 3.9 | 0.30 | 0.68 | 2-step | 750 |
| 2 | 11.5 | 4.0 | 0.39 | 0.62 | 2-step | 750 |
| 3 | 6.30 | 2.8 | 0.37 | 0.22 | 2-step | 750 |
| 4 | 13.0 | 4.0 | 0.33 | 0.56 | 160° C. 10 min | 750 |
| 5 | 15.0 | 5.2 | 0.33 | 0.86 | 160° C. 10 min | 500 |
| 6 | 12.0 | 5.8 | 0.30 | 0.70 | 160° C. 10 min | 500 |
| 7 | 11.1 | 5.2 | 0.35 | 0.67 | 160° C. 10 min | 500 |

Number of coats for spray-on active layer: 5 light layers, and 2 heavy layers

Number of coats for the spray-on PEDOT:PSS layer: 6-7 light layers, and 5 heavy layers Number of coats for the spray-on $Cs_2CO_3$ layer: 1 light layer An interesting phenomenon was observed with the inverted organic photovoltaic cells, which is termed 'photo annealing'. Under constant illumination from the solar simulator, a sudden change in I-V characteristics occurs after time, which is device dependent, ranging from 10 min to several hours. For example, the solar array required about 15 min to 'photo anneal', described in Table 4, and reached a maximum PCE after 2.5 h under illumination.

TABLE 4

Change of array I-V characteristics under solar illumination.

| Time | $I_{sc}$ (mA) | $V_{oc}$ (V) | FF | η (%) |
|---|---|---|---|---|
| Day 1 | | | | |
| 0 min | 17 | 4.0 | 0.30 | 0.68 |
| 12 min | 28 | 4.2 | 0.35 | 1.40 |
| 150 min | 35 | 4.2 | 0.37 | 1.80 |
| Day 2 | | | | |
| 0 min | 18 | 4.2 | 0.35 | 0.88 |
| Day 3 | | | | |
| 0 min | 15 | 4.4 | 0.29 | 0.64 |
| 120 min | 27 | 4.8 | 0.38 | 1.68 |

EXAMPLE 7

Devices formed from all-spray methodology permits economic manufacture of organic photovoltaic cells. However, current technologies require human intervention, such as hand wiping of the various layers to remove spray overflow and spray application to sections of the device that are intended to no be coated by the sprayed-on layer. The present methodology removes the need for hand wiping, due to the use of masks and specific spray conditions, such as air pressure and spray distance. Spray application of the active layer at 90° C. improved the active layer nanomorphology, which further improved final device performance. More importantly, the methodology increased shunt resistance and fill factor, thereby improving power conversion efficiency more than 2× comparing with previous methods, as seen in Table 5.

TABLE 5

Device characteristics of various organic photovoltaic cells.

| Reference info | RMS | $V_{oc}$ | $I_{sc}$ | PCE %[1] | notes |
|---|---|---|---|---|---|
| — | | | | 1.6 | OPV from example 1 |
| 13/854,602 | | 4.2 V | 35 mA | 0.68 | inverted, 20% transparency |
| 13/400,352 | | 6.48 V | 0.23 mA | 0.68 | inverted, 20% transparency |
| 13/854,602 | | 0.57 V | 0.55 mA | 3.5 | control device |
| No, et al.[2] | 5.47 | | | 4.01 | spray on with $TiO_2$ |
| No, et al.[2] | 7.08 | | | 3.56 | spin coated with $TiO_2$ |

[1]For first four entries, the PCE % is the initial value, prior to photo annealing for 2.5 hours.
[2]No, et al., Performance of bulk heterojunction solar cells fabricated using spray-deposited poly[[9-(1-octylnonyl)-9H-carbazole-2,7-diyl]-2,5-thiophenediyl-2,1,3-benzothiadiazole-4,7-diyl-2,5-thiophenediyl]/[6,6]-phenyl C71 butyric acid methyl ester blend active layers. Int'l J Photoenergy. 2013; Article ID 202467.

The fabricated array (4"×4") manufactured using the disclosed methodology has smaller cell occupancy, about 20% less than the cell occupancy in U.S. application Ser. Nos. 13/400,352 and 13/854,602. However, as this results in improved transparency, it is not a drawback for organic photovoltaic windows.

In the preceding specification, all documents, acts, or information disclosed do not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

It is also to be understood that the following claims are intended to cover all of the generic and specific features of the invention herein described, and all statements of the scope of the invention which, as a matter of language, might be said to fall there between.

What is claimed is:

1. A method of manufacturing an organic solar photovoltaic cell;
comprising the steps:
obtaining an indium oxide-patterned substrate;
forming a sol-gel zinc oxide precursor solution;
spraying the sol-gel zinc oxide precursor solution onto the patterned indium oxide substrate to form a zinc oxide layer consisting of zinc oxide;
annealing the zinc oxide layer;
spraying an active layer comprising a bulk heterojunction composition on the zinc oxide layer;
spraying an anodic layer comprising poly (3,4) ethylenedioxythiophene:poly-styrenesulfonate mixed with 5 vol. % of dimethylsulfoxide on the active layer to form a solar photovoltaic cell array;
placing the solar photovoltaic cell into high vacuum for at least 1 hour;
annealing the solar photovoltaic cell; and
applying an electrodic material to the solar photovoltaic cell array.

2. The method of claim 1, wherein the indium oxide is patterned by:
attaching a mask to the indium oxide layer;
applying photoresist;
etching the indium oxide layer; and
cleaning the etched indium oxide layer.

3. The method of claim 2, wherein the photoresist is applied by airbrush, where the airbrush pressure between 10 and 40 psi.

4. The method of claim 2, wherein the indium oxide layer is etched using a composition of 20% HCl and 7% $HNO_3$ at between 90° C. and 130° C.

5. The method of claim 1, wherein cleaned indium oxide layer is annealed at 145° C. for 4 minutes and cleaned.

6. The method of claim 1, wherein the sol gel zinc oxide precursor solution was prepared by dissolving zinc acetate in a mixture of 2-methoxyethanol and ethanolamine or methoxyethoxyacetic acid.

7. The method of claim 1, wherein the sol gel zinc oxide precursor solution is stirred and heated at 60° C. for 1 hour prior to spraying.

8. The method of claim 1, further comprising covering the indium oxide layer with a mask to tape prior to spraying the sol gel zinc oxide precursor solution.

9. The method of claim 1, wherein the sol gel zinc oxide precursor solution is sprayed at a distance of 8 cm to 14 cm from the substrate surface;
where the airbrush is set to a pressure of 20 psi using an inert gas and a volumetric flow rate of the solution of 0.05 mL/min to 0.2 mL/min.

10. The method of claim 1, wherein the annealing of the zinc oxide layer comprises the steps:
heating the zinc oxide layer to 275° C.; and
allowing the zinc oxide layer to cool for 30 minutes.

11. The method of claim 10, further comprising washing the zinc oxide layer and drying with an inert gas.

12. The method of claim 1, wherein the bulk heterojunction composition is prepared by the steps:
dissolving poly(3-hexylthiophene) in dichlorobenzene;
dissolving phenyl-C60-butyric acid-methyl ester in dichlorobenzene;
stirring the dissolved poly(3-hexylthiophene) overnight at 60° C.;
stirring the dissolved phenyl-C60-butyric acid-methyl ester overnight at 60° C.; and
mixing the dissolved poly(3-hexylthiophene) and the dissolved phenyl-C60-butyric acid -methyl ester together at a 1:1 v/v ratio for at least one hour.

13. The method of claim 1, wherein the spraying of the active layer further comprises:
fixing a mask to the substrate;
heating the substrate to 90° C.; and
spraying the heterojunction composition.

14. The method of claim 1, wherein the active layer is sprayed at a distance of 8 cm to 14 cm from the substrate surface; and
where the airbrush was set to a pressure of 20 psi using an inert gas and a volumetric flow rate of the solution of 0.4 mL/min to 0.9 mL/min.

15. The method of claim 1, wherein the spraying of the active layer further comprises:
fixing a mask to the substrate;
heating the substrate to 90° C.; and
spraying the heterojunction composition.

16. The method of claim 1, wherein the layer comprising poly (3,4) ethylenedioxythiophene:poly-styrenesulfonate mixed with 5 vol. % of dimethylsulfoxide is prepared by the steps:
    filtering the poly(3,4-ethylenedioxythiophene) poly(styrenesulfonate);
    adding dimethylsulfoxide to 5% v/v; and
    subjecting the solution to sonic energy for 1 hour prior to spraying.

17. The method of claim 1, wherein the layer comprising poly (3,4) ethylenedioxythiophene:poly-styrenesulfonate mixed with 5 vol. % of dimethylsulfoxide is sprayed at a distance of 3 cm to 7 cm from the substrate surface;
    where the airbrush was set to a pressure of 20 psi using an inert gas and a volumetric flow rate of the solution of 0.05 mL/min to 0.1 mL/min.

18. The method of claim 17, further comprising fixing a mask to the substrate prior to spraying the layer comprising poly (3,4) ethylenedioxythiophene:poly-styrenesulfonate mixed with 5 vol. % of dimethylsulfoxide.

19. The method of claim 1, wherein the high vacuum is $10^{-6}$ Torr.

20. The method of claim 1, wherein the device was annealed by:
    heating the device to 150° C.; and
    allowing the device to cool to room temperature.

21. The method of claim 1, wherein the device is prepared without wiping the device after spray application of a layer.

* * * * *